(12) United States Patent
Satoh et al.

(10) Patent No.: US 11,082,048 B1
(45) Date of Patent: Aug. 3, 2021

(54) SEMICONDUCTOR INTEGRATED CIRCUIT, RECEIVING DEVICE, AND CONTROL METHOD OF RECEIVING DEVICE

(71) Applicant: Kioxia Corporation, Tokyo (JP)

(72) Inventors: Yuji Satoh, Kawasaki (JP); Mitsuyuki Ashida, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/017,446

(22) Filed: Sep. 10, 2020

(30) Foreign Application Priority Data

Mar. 19, 2020 (JP) .............................. JP2020-049707

(51) Int. Cl.
*H03L 7/08* (2006.01)
*H03L 7/081* (2006.01)
*H03K 7/08* (2006.01)
*H03L 7/18* (2006.01)
*H03L 7/183* (2006.01)

(52) U.S. Cl.
CPC ............. *H03L 7/0805* (2013.01); *H03K 7/08* (2013.01); *H03L 7/0818* (2013.01); *H03L 7/183* (2013.01); *H03L 7/1806* (2013.01)

(58) Field of Classification Search
CPC ........................... H03L 7/0805; H03L 7/0818
See application file for complete search history.

(56) References Cited

U.S. PATENT DOCUMENTS

| 8,730,758 | B2 | 5/2014 | Lee et al. |
| 9,001,599 | B2 | 4/2015 | Swanson |
| 9,658,642 | B2 | 5/2017 | Mozak |
| 10,103,870 | B2 * | 10/2018 | Shibasaki ............... H03L 7/085 |
| 10,630,461 | B2 * | 4/2020 | Abramzon ............... H04L 7/10 |
| 10,666,466 | B2 | 5/2020 | Satoh et al. |
| 2020/0092078 | A1 * | 3/2020 | Fujii ........................ G06F 1/10 |
| 2021/0067312 | A1 * | 3/2021 | Kawasoe .................. H04L 7/02 |
| 2021/0082864 | A1 * | 3/2021 | Satoh ...................... H01L 24/75 |

FOREIGN PATENT DOCUMENTS

| JP | 2012-531664 A | 12/2012 |
| JP | 2014-517422 A | 7/2014 |
| JP | 2017-208118 A | 11/2017 |
| JP | 2020-48060 A | 3/2020 |
| JP | 2021-44787 A | 3/2021 |

* cited by examiner

*Primary Examiner* — Patrick O Neill
(74) *Attorney, Agent, or Firm* — Oblon, McClelland, Maier & Neustadt, L.L.P.

(57) ABSTRACT

According to one embodiment, in a semiconductor integrated circuit, a determination circuit is configured to generate first transition information, second transition information and phase determination information, with respect to a signal level of a modulation signal. The first transition information indicates a state of a first transition edge of transition between a first signal level and a second signal level. The second transition information indicates a state of a second transition edge of transition between a third signal level and a fourth signal level. The phase determination information indicates a result of a phase determination of a clock signal. An estimation circuit is configured to estimate a deviation between a timing of the first transition edge and a timing of the second transition edge according to the first transition information, the second transition information, and the phase determination information.

20 Claims, 14 Drawing Sheets

FIG.6

| DATA-0 | DATA-1 | POL-0 | POL-1 | AMP-0 | AMP-1 | AMP-XOR | POL-XOR | CENTER-X | SMALL-X | BIG-X |
|---|---|---|---|---|---|---|---|---|---|---|
| 0 | 0 | 0 | 0 | 1 | 1 | 0 | 0 | 0 | 0 | 0 |
| 0 | 1 | 0 | 0 | 1 | 0 | 1 | 0 | 0 | 0 | 0 |
| 0 | 2 | 0 | 1 | 1 | 0 | 1 | 1 | 0 | 0 | 0 |
| 0 | 3 | 0 | 1 | 1 | 1 | 0 | 1 | 1 | 0 | 1 |
| 1 | 0 | 0 | 0 | 0 | 1 | 1 | 0 | 0 | 0 | 0 |
| 1 | 1 | 0 | 1 | 0 | 0 | 0 | 1 | 1 | 1 | 0 |
| 1 | 2 | 0 | 1 | 0 | 1 | 1 | 1 | 0 | 0 | 0 |
| 1 | 3 | 1 | 0 | 0 | 0 | 0 | 1 | 1 | 1 | 0 |
| 2 | 0 | 1 | 0 | 0 | 1 | 1 | 0 | 0 | 0 | 0 |
| 2 | 1 | 1 | 1 | 0 | 0 | 0 | 0 | 0 | 0 | 0 |
| 2 | 2 | 1 | 1 | 1 | 1 | 1 | 1 | 1 | 0 | 1 |
| 2 | 3 | 1 | 0 | 1 | 0 | 1 | 0 | 0 | 0 | 0 |
| 3 | 0 | 1 | 0 | 1 | 0 | 1 | 0 | 0 | 0 | 0 |
| 3 | 1 | 1 | 1 | 1 | 1 | 0 | 0 | 0 | 0 | 0 |
| 3 | 2 | 1 | 1 | 1 | 1 | 0 | 0 | 0 | 0 | 0 |

FIG.7

| φEDG-0 | POL-0 | φEDG-1 | EARLY | LATE |
|---|---|---|---|---|
| 0 | 0 | 1 | 0 | 1 |
| 0 | 1 | 1 | 1 | 0 |
| 1 | 0 | 0 | 1 | 0 |
| 1 | 1 | 0 | 0 | 1 |
| OTHER THAN THOSE ABOVE | | | 0 | 0 |

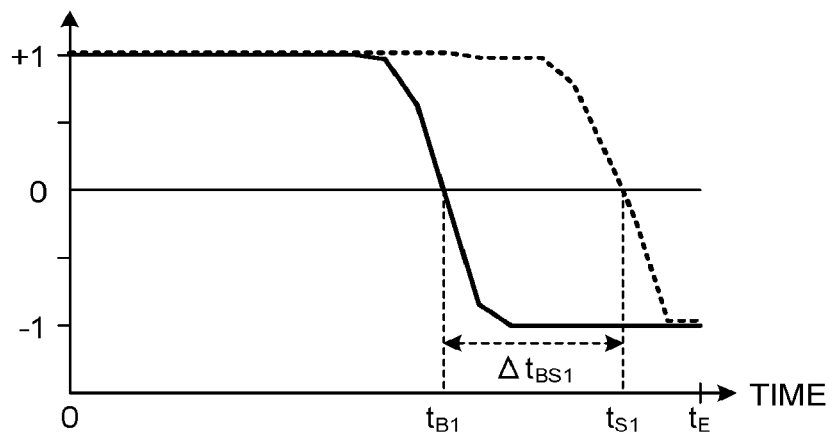
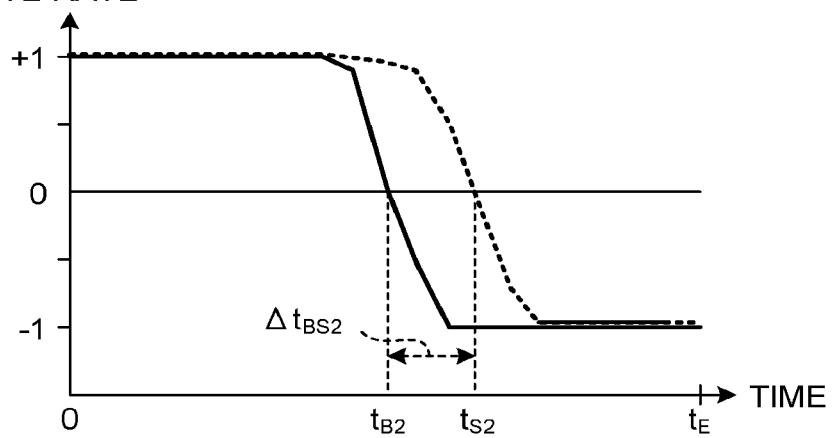
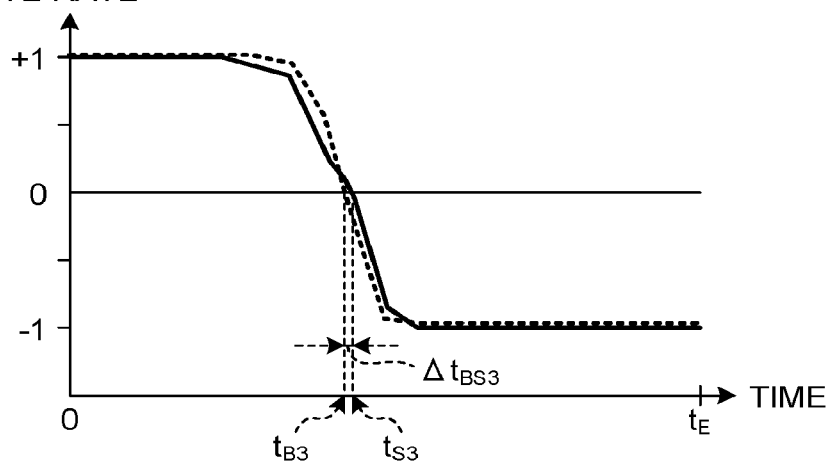

SEMICONDUCTOR INTEGRATED CIRCUIT, RECEIVING DEVICE, AND CONTROL METHOD OF RECEIVING DEVICE

CROSS-REFERENCE TO RELATED APPLICATIONS

This application is based upon and claims the benefit of priority from Japanese Patent Application No. 2020-049707, filed on Mar. 19, 2020; the entire contents of which are incorporated herein by reference.

FIELD

Embodiments described herein relate generally to a semiconductor integrated circuit, a receiving device, and a control method of the receiving device.

BACKGROUND

In a receiving device including a semiconductor integrated circuit, a phase determination regarding an edge of a signal received by the semiconductor integrated circuit is performed, and a clock signal corresponding to the received signal is regenerated based on a result of the phase determination. At this time, it is desired to properly regenerate the clock signal.

BRIEF DESCRIPTION OF THE DRAWINGS

FIG. 6 is a diagram illustrating an operation of the determination circuit in the receiving device according to an embodiment;

FIG. 7 is a diagram illustrating another operation of the determination circuit in the receiving device in the embodiment;

FIGS. 9A to 9C are diagrams illustrating operations of the estimation circuit in the receiving device according to the embodiment;

DETAILED DESCRIPTION

In general, according to one embodiment, there is provided a semiconductor integrated circuit including a determination circuit and an estimation circuit. The determination circuit is configured to generate first transition information, second transition information and phase determination information, with respect to a signal level of a modulation signal. The modulation signal makes transition between a first signal level, a second signal level, a third signal level and a fourth signal level. The second signal level is a level higher than the first signal level. The third signal level is a level between the first signal level and the second signal level. The fourth signal level is a level between the third signal level and the second signal level. The first transition information indicates a state of a first transition edge of transition between the first signal level and the second signal level. The second transition information indicates a state of a second transition edge of transition between the third signal level and the fourth signal level. The phase determination information indicates a result of a phase determination of a clock signal. The estimation circuit is configured to estimate a deviation between a timing of the first transition edge and a timing of the second transition edge according to the first transition information, the second transition information, and the phase determination information.

Exemplary embodiments of a receiving device will be explained below in detail with reference to the accompanying drawings. The present invention is not limited to the following embodiments.

Embodiment

Figure 1:
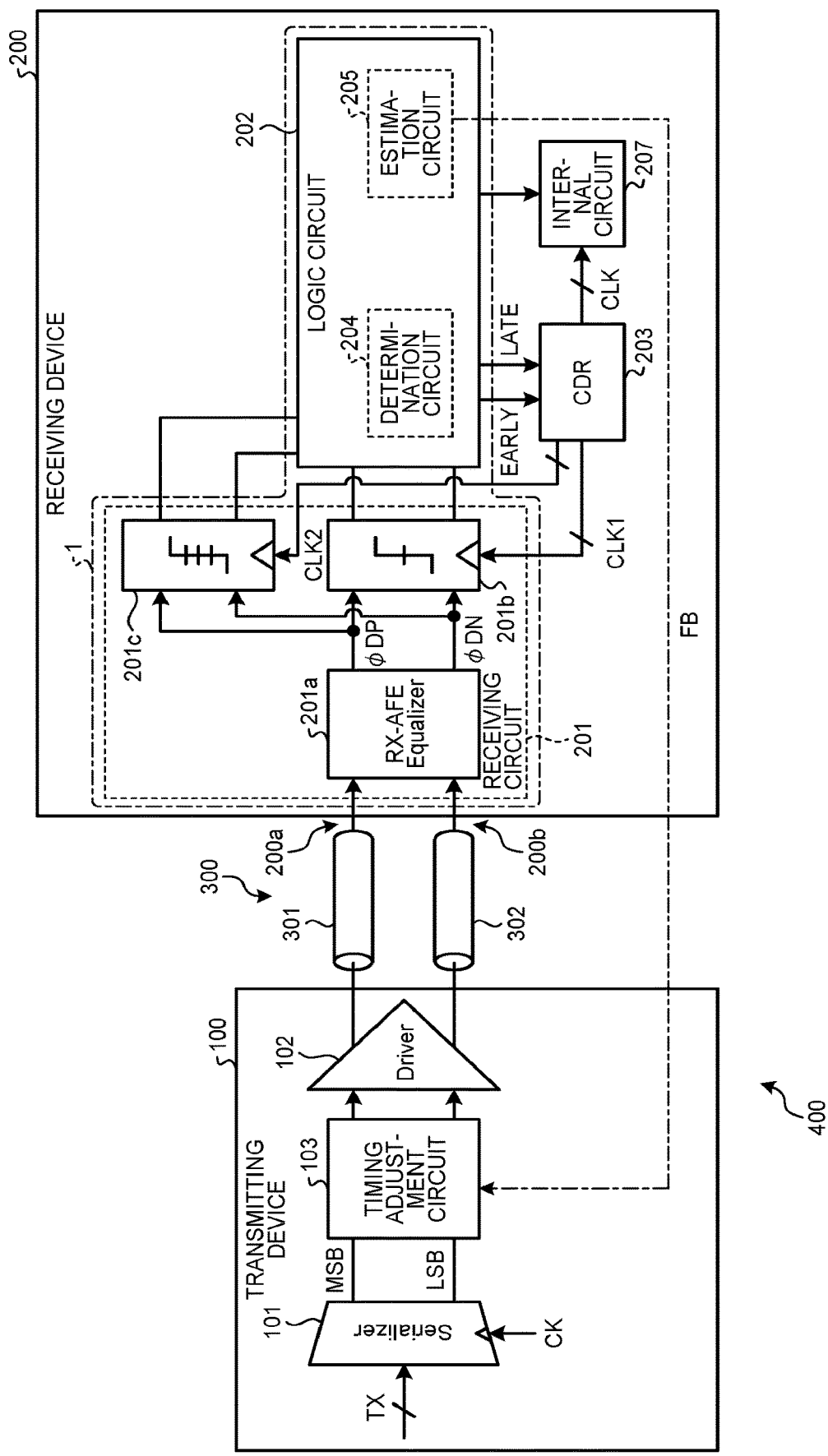
FIG. 1 is a diagram illustrating a configuration of a communication system including a semiconductor integrated circuit according to an embodiment.

The semiconductor integrated circuit according to the embodiment may be used, for example, in a communication system that performs wired communication. For example, a communication system 400 to which the semiconductor integrated circuit 1 is applied is configured as illustrated in FIG. 1. FIG. 1 is a diagram illustrating a configuration of the communication system 400 including a receiving device 200 including a semiconductor integrated circuit 1 according to the embodiment.

The communication system 400 includes a transmitting device 100, a receiving device 200, and a wired communication path 300. The transmitting device 100 and the receiving device 200 are communicably connected via the wired communication path 300. The transmitting device 100 includes a serializer 101, a driver 102, and a timing adjustment circuit 103. In the transmitting device 100, transmission data φTX is serialized into a bit pattern by the serializer 101 in a particular procedure. The serialized bit pattern is pulse amplitude modulated by the driver 102 via the timing adjustment circuit 103. The driver 102 transmits a modulation signal to the receiving device 200 via the wired transmission path 300.

Figure 2:
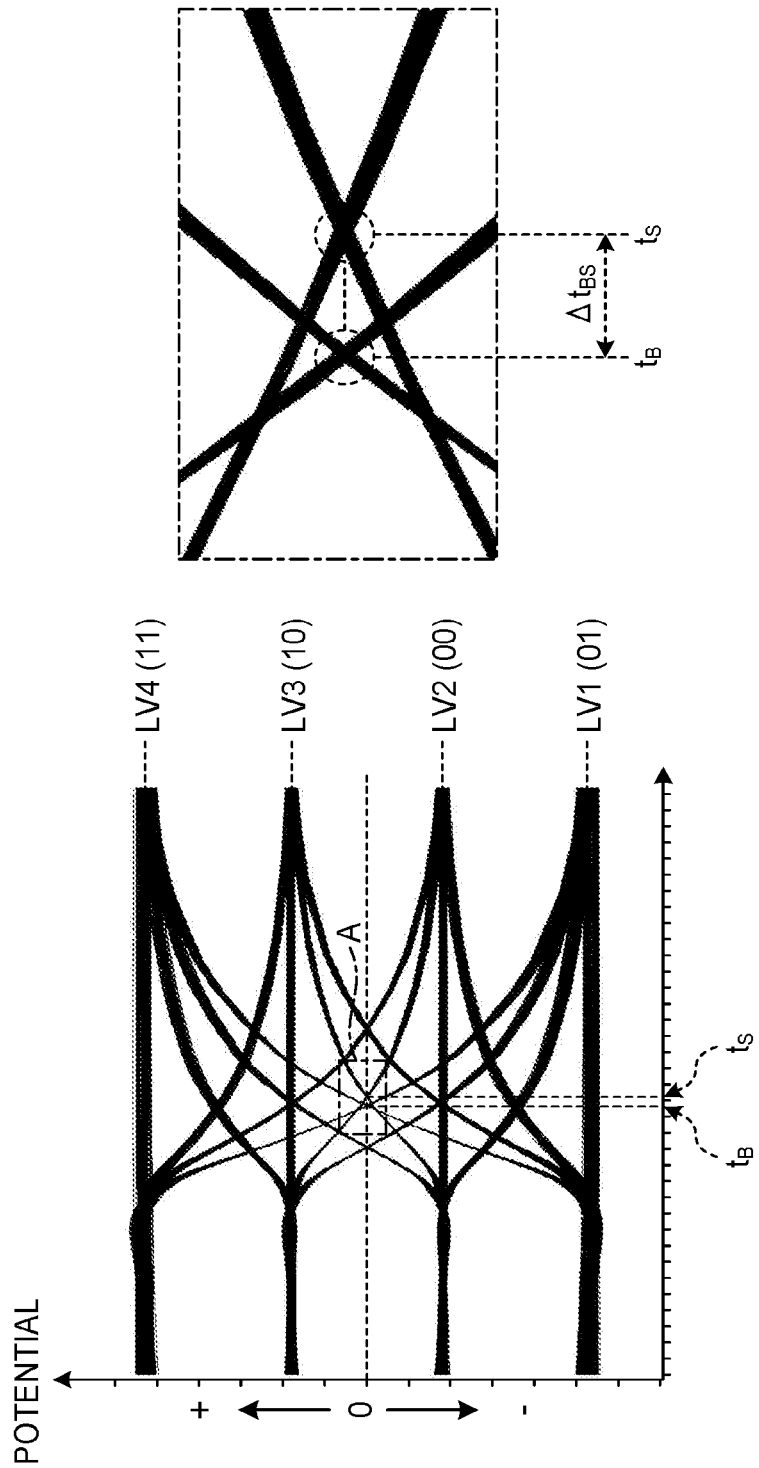
FIGS. 2A and 2B are diagrams illustrating signal level transition timings according to an embodiment.

For example, when the modulation signal is a pulse amplitude modulation four (PAM4) signal corresponding to a 2-bit bit pattern, the modulation signal may take signal levels LV1 to LV4 corresponding to four potentials as illustrated in FIG. 2A. FIGS. 2A and 2B are diagrams illustrating transition timings of signal levels, and FIG. 2A illustrates the transition timings of the signal levels together with the signal levels LV1 to LV4. The signal level (an example of the first signal level) LV1 represents a bit pattern "01". The signal level (an example of the third signal level) LV2 represents a bit pattern "00". The signal level (an example of the fourth signal level) LV3 represents a bit pattern "10". The signal level (an example of the second signal level) LV4 represents a bit pattern "11". In the bit patterns, the most significant bit may be referred to as MSB and the least significant bit may be referred to as LSB. FIG. 1 illustrates a configuration in which a transmission path for MSB and a transmission path for LSB are provided in parallel with each other between the serializer 101 and the driver 102 in the transmitting device 100.

The wired communication path 300 is differentially configured and has a P-side communication path 301 and an N-side communication path 302. The receiving device 200 includes receiving nodes 200a and 200b, the semiconductor integrated circuit 1, a clock data recovery (CDR) circuit 203, and an internal circuit 207.

The semiconductor integrated circuit 1 includes a receiving circuit 201 and a logic circuit 202. The receiving circuit 201 includes an analog front end (AFE) 201a, an edge sampler 201b, and a data sampler 201c. The P-side communication path 301 in the wired communication path can be connected to the receiving node 200a. The N-side communication path 302 in the wired communication path 300 can be connected to the receiving node 200b. Upon receiving the signal via the wired communication path 300, the receiving device 200 equalizes a signal attenuation by the transmission path with the AFE 201a. The equalized data signals φDP and φDN are sampled by the edge sampler 201b in synchronization with a clock signal CLK⁻ and are sampled by the data sampler 201c in synchronization with a clock signal CLK. Each sampling result is output to the logic circuit 202. The logic circuit 202 restores transmission data based on the each sampling result, outputs the restored data to the internal circuit 207, and performs a particular operation on the restored data by the determination circuit 204 and the estimation circuit 205.

The logic circuit 202 includes the determination circuit 204. The determination circuit 204 determines a phase of an edge of the restored data based on the sampling results, and outputs phase determination information (EARLY, LATE) indicating the determination results to a CDR circuit 203. The CDR circuit 203 performs phase adjustment of clock signals CLK and CLK⁻ that are currently being regenerated, according to the phase determination information. The CDR circuit 203 performs phase adjustment that delays the phase of the clock signal CLK that is currently being regenerated, according to the phase determination information of an advanced phase (e.g., EARLY=1). The CDR circuit 203 performs phase adjustment that advances the phase of the clock signal CLK that is currently being regenerated, according to the phase determination information of a delay phase (e.g., LATE=1). The CDR circuit 203 outputs the clock signal CLK after the phase adjustment to the data sampler 201c and the internal circuit 207, and outputs the clock signal CLK⁻ that is a logically inverted the clock signal CLK after the phase adjustment to the edge sampler 201b.

At this time, if the phase determination is appropriately performed and the phase adjustment according to the phase determination information is appropriately performed, the clock signal CLK is properly regenerated. Thereby, the data signal is appropriately sampled by the data sampler 201c, so that a signal quality of the restored data may be improved. In order to properly regenerate the clock signal and improve the signal quality, it is desired to improve a timing accuracy of edge sampling by the edge sampler 201b.

The edge sampling by the edge sampler 201b is performed using an edge of a waveform (that is, a transition edge) due to the transition between the signal levels. In order to improve the timing accuracy of edge sampling in PAM4, it is desired that a timing $t_B$ of a transition edge (hereinafter, referred to as BIG-X) between the signal level LV1 and the signal level LV4 illustrated in FIG. 2A, and a timing $t_S$ of a transition edge (hereinafter referred to as SMALL-X) between the signal level LV2 and the signal level LV3 substantially match in a time direction.

In the BIG-X, one of the differential signals makes transition from the signal level LV1 to the signal level LV4, and the other of the differential signals makes transition from the signal level LV4 to the signal level LV1. A timing at which one and the other waveforms having the signal levels LV1 and LV4, of the differential signal intersect is defined as the timing $t_B$ of BIG-X.

In the SMALL-X, one of the differential signals makes transition from the signal level LV2 to the signal level LV3, and the other of the differential signals makes transition from the signal level LV3 to the signal level LV2. The timing $t_S$ at which one and the other waveforms having the signal levels LV2 and LV3, of the differential signal intersect is defined as the timing of the SMALL-X.

However, by a load imbalance due to a parasitic resistance R and a parasitic capacitance C of each of the MSB path and the LSB path in the driver 102 of the transmitting device 100, and an influence of an attenuation of a radio frequency component generated in the wired communication path 300, the timing $t_B$ of BIG-X and the timing $t_S$ of SMALL-X may be temporally separated as illustrated in FIG. 2B. FIG. 2B is a waveform diagram illustrating an enlarged part A of FIG. 2A. FIG. 2B illustrates a deviation $\Delta t_{BS}$ between the timing $t_B$ of BIG-X and the timing $t_S$ of SMALL-X. If the deviation $\Delta t_{BS}$ is large, jitter characteristics of the clock signal CLK regenerated by the CDR circuit 203 are likely to be deteriorated and the signal quality of the restored data is deteriorated, because the result of the phase determination by the determination circuit 204 is likely to vary. Further, the deterioration of the signal quality may become more remarkable as a speed of the communication system increases, a process of each circuit becomes finer, and the wire communication path becomes longer.

Therefore, in the present embodiment, in the receiving device 200, the semiconductor integrated circuit 1 detects the deviation $\Delta t_{BS}$ between the timing of BIG-X and the timing of SMALL-X, and feeds back a control signal FB for adjusting the deviation $\Delta t_{BS}$ to the transmitting device 100 in order to improve the jitter characteristics of the clock signal CLK.

Specifically, as illustrated in FIG. 1, the logic circuit 202 in the semiconductor integrated circuit 1 includes the estimation circuit 205. The transmitting device 100 includes the timing adjustment circuit 103. In the receiving device 200, when the modulation signal from the transmitting device 100 is received, the semiconductor integrated circuit 1 detects the deviation $\Delta t_{BS}$ between the timing $t_B$ of BIG-X and the SMALL-X timing $t_S$ of SMALL-X. That is, in the semiconductor integrated circuit 1, the determination circuit 204 generates transition information BIG-X indicating presence or absence of the transition edge of BIG-X, transition information SMALL-X indicating presence or absence of the transition edge of SMALL-X, and the phase determination information (EARLY, LATE) indicating the result of the phase determination of the clock signal CLK, and outputs the generated information to the estimation circuit 205. The estimation circuit 205 estimates the deviation $\Delta t_{BS}$ between the timing $t_B$ of BIG-X and the timing $t_S$ of SMALL-X according to the output information. The estimation circuit 205 generates the control information FB for adjusting the deviation $\Delta t_{BS}$ according to the estimation result of the deviation $\Delta t_{BS}$, and feeds the generated control information FB back to the transmitting device 100. Accordingly, the timing adjustment circuit 103 of the transmitting device 100 performs timing adjustment based on the control signal FB, and a signal after adjustment is received by the receiving device 200 from the transmitting device 100 through the wired communication path 300. The determination circuit 204 of the semiconductor integrated circuit 1 regenerates the transition information BIG-X, the transition information SMALL-X, and the phase determination information (EARLY, LATE) for the signal level of the received modulation signal after adjustment. At this time, if the deviation $\Delta t_{BS}$ becomes smaller, the accuracy of the phase determination information (EARLY, LATE) may be improved. As a result, in the receiving device 200, the CDR circuit 203 may properly regenerate the clock signal CLK according to the phase determination information (EARLY, LATE) for the modulation signal after adjustment. That is, the jitter characteristics of the regenerated clock signal CLK may be improved.

Figure 3:
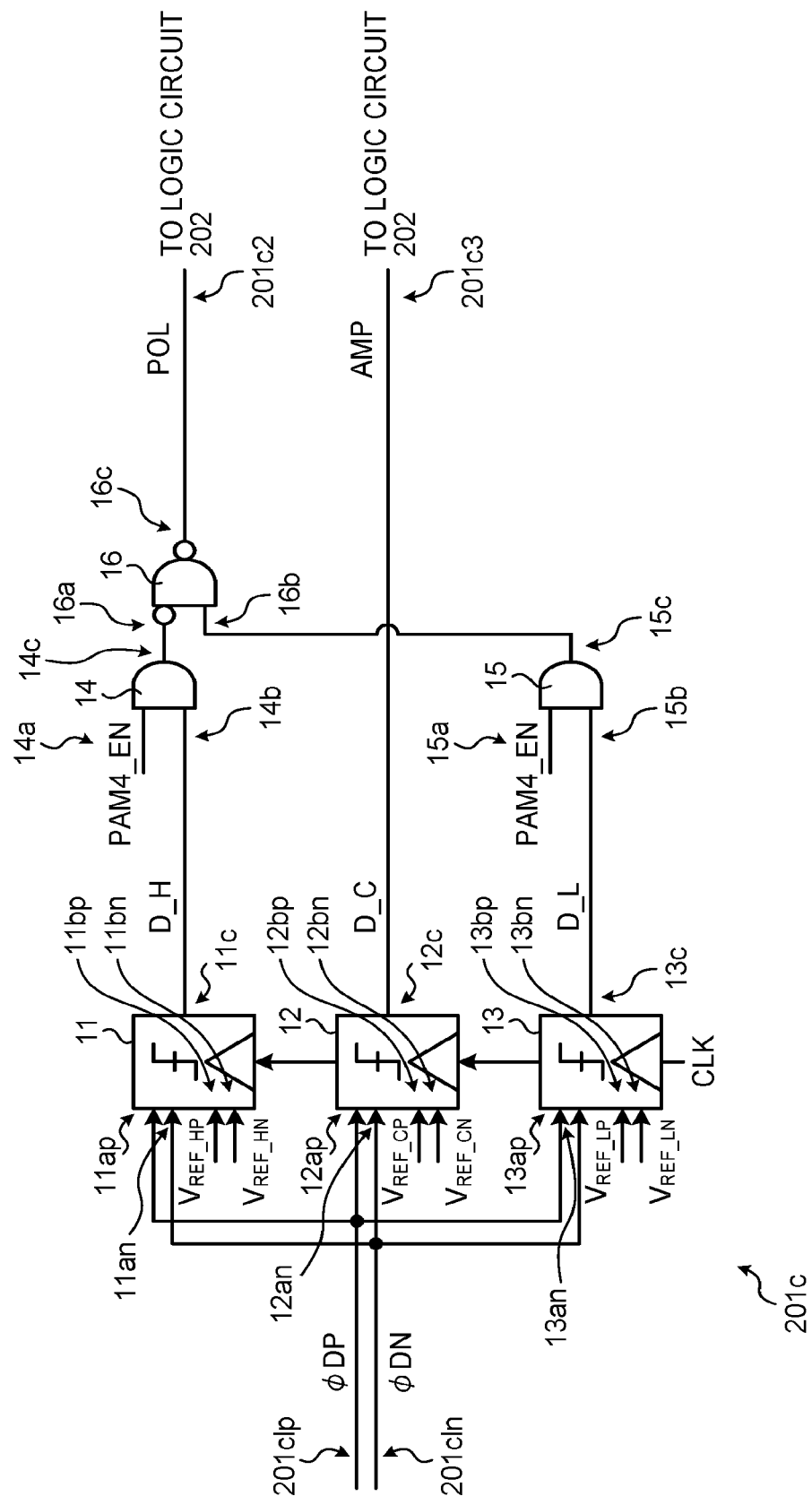
FIG. 3 is a diagram illustrating a configuration of a data sampler in a receiving device according to an embodiment.

More specifically, the data sampler 201c illustrated in FIG. 1 receives data signals φDP and φDN and generates a polarity signal POL indicating a polarity and an amplitude signal AMP indicating an absolute amplitude value for a differential signal level of the data signals φDP and φDN. The data sampler 201c may be configured as illustrated in FIG. 3. FIG. 3 is a diagram illustrating a configuration of the data sampler 201c in the semiconductor integrated circuit 1 included in the receiving device 200.

The data sampler 201c includes a plurality of comparators 11 to 13, a plurality of logic gates 14 to 16, two input nodes 201c1p and 201c1n, and two output nodes 201c2 and 201c3. The plurality of comparators 11 to 13 are arranged between the input nodes 201c1p and 201c1n and the plurality of logic gates 14 to 16. The plurality of logic gates 14 to 16 are arranged between the plurality of comparators 11 to 13 and the output nodes 201c2 and 201c3.

The comparator 11 has four input nodes 11ap, 11an, 11bp, and 11bn and an output node 11c. The input nodes 11ap and 11an are electrically connected to the input nodes 201c1p and 201c1n, respectively. The input nodes 11bp and 11bn receive threshold voltages $V_{REF\_HP}$ and $V_{REF\_HN}$ from a control circuit (not illustrated) in the receiving device 200, respectively. The threshold voltage $V_{REF\_HP}$ has a potential between the signal level LV3 and the signal level LV4. The threshold voltage $V_{REF\_HN}$ has a potential between the signal level LV1 and the signal level LV2. The output node 11c is connected to an input node 14b of the logic gate 14. The comparator 11 compares the differential signal level of the data signals φDP and φDN with a difference between the threshold voltages $V_{REF\_HP}$ and $V_{REF\_HN}$ in synchronization with the clock signal CLK, and outputs a comparison result D_H to the input node 14b of the logic gate 14.

The comparator 12 has four input nodes 12ap, 12an, 12bp, and 12bn and an output node 12c. The input nodes 12ap and 12an are electrically connected to the input nodes 201c1p and 201c1n, respectively. The input nodes 12bp and 12bn receive the threshold voltages $V_{REF\_CP}$ and $V_{REF\_CN}$ from the control circuit in the receiving device 200, respectively. The threshold voltages $V_{REF\_CP}$ and $V_{REF\_CN}$ each have a potential between the signal level LV2 and the signal level LV3. The output node 12c is connected to the output node 201c3 of the data sampler 201c. The comparator 12 compares the differential signal level of the data signals φDP and φDN with a difference between the threshold voltages $V_{REF\_CP}$ and $V_{REF\_CN}$ in synchronization with the clock signal CLK, and outputs a comparison result D_C to the logic circuit 202 as an amplitude signal AMP.

The comparator 13 has four input nodes 13ap, 13an, 13bp, and 13bn and an output node 13c. The input nodes 13ap and 13an are electrically connected to the input nodes 201c1p and 201c1n, respectively. The input nodes 13bp and 13bn receive the threshold voltages $V_{REF\_LP}$ and $V_{REF\_LN}$ from the control circuit in the receiving device 200, respectively. The threshold voltage $V_{REF\_LP}$ has a potential between the signal level LV1 and the signal level LV2. The threshold voltage $V_{REF\_LN}$ has a potential between the signal level LV3 and the signal level LV4. The output node 13c is connected to an input node 15b of the logic gate 15. The comparator 13 compares the differential signal levels of the data signals φDP and φDN with a difference between the threshold voltages $V_{REF\_LP}$ and $V_{REF\_LN}$ in synchronization with the clock signal CLK, and outputs a comparison result D_L to the input node 15b of the logic gate 15.

The logic gate 14 has input nodes 14a and 14b and an output node 14c. The input node 14a receives an enable signal PAM4_EN from the control circuit in the receiving device 200. The enable signal PAM4_EN is a signal that becomes an active level when the modulation scheme of the modulation signal received from the transmitting device 100 is the PAM4. The input node 14b is connected to the output node 11c of the comparator 11. The output node 14c is connected to an input node 16a of the logic gate 16. The logic gate 14 is, for example, a logic product gate, calculates a logic product of the enable signal PAM4_EN and the comparison result D_H of the comparator 11, and outputs the calculation result to the input node 16a of the logic gate 16.

The logic gate 15 has input nodes 15a and 15b and an output node 15c. The input node 15a receives the enable signal PAM4_EN from the control circuit in the receiving device 200. The input node 15b is connected to the output node 13c of the comparator 13. The output node 15c is connected to an input node 16b of the logic gate 16. The logic gate 15 is, for example, a logic product gate, calculates a logic product of the enable signal PAM4_EN and the comparison result D_L of the comparator 13, and outputs the calculation result to the input node 16b of the logic gate 16.

The logic gate 16 has input nodes 16a and 16b and an output node 16c. The input node 16a is connected to the output node 14c of the logic gate 14. The input node 16b is connected to the output node 15c of the logic gate 15. The output node 15c is connected to the output node 201c2 of the data sampler 201c. The logic gate 16 is, for example, a logic gate that performs a calculation that logically inverts a logic product of a logic inversion of the signal input to the input node 16a and the signal input to the input node 16b. The logic gate 16 outputs a calculation result for a calculation result of the logic gate 14 and a calculation result of the logic gate 15 to the logic circuit 202 as a polarity signal POL.

Figure 4:
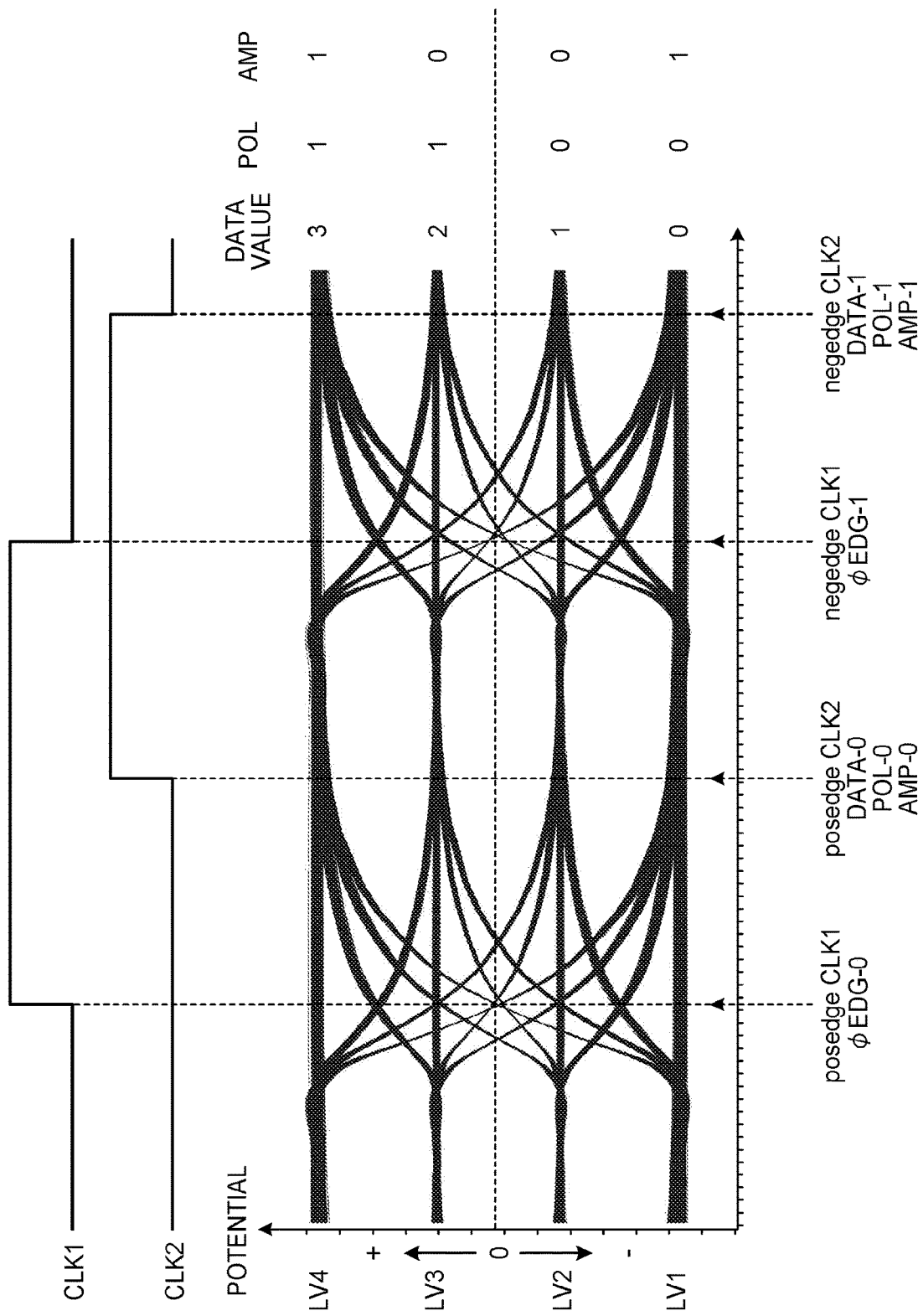
FIG. 4 is a waveform diagram illustrating operations of a data sampler and an edge sampler in the receiving device according to an embodiment.

Next, operations of the data sampler 201c and the edge sampler 201b will be described with reference to FIG. 4. As illustrated in FIG. 4, the signal levels LV1, LV2, LV3, and LV4 of the PAM4 correspond to data DATA values 0, 1, 2, and 3, respectively. FIG. 4 is a waveform diagram for explaining the operations of the data sampler 201c and the edge sampler 201b in the receiving device 200.

The edge sampler 201b samples a differential signal 'φDP–φDN' of data at the timing of a rising edge of the clock signal CLK1 (posedge CLK1) to generate an edge signal φEDG-0. The edge signal φEDG is a signal indicating whether or not the edge of the waveform makes transition between a (−) side amplitude and a (+) side amplitude. For example, when the edge of the waveform makes transition from "− side" to "+ side", a value of the edge signal φEDG changes from "0" to "1". When the edge of the waveform makes transition from "+ side" to "− side", the value of the edge signal φEDG changes from "1" to "0".

The data sampler 201c samples a differential signal 'φDP–φDN' of data at a rising edge timing (posedge CLK2) of a clock signal CLK2, and generates a polarity signal POL-0 and an amplitude signal AMP-0 corresponding to a value of data DATA-0.

As illustrated in FIG. 4, the MSB, which is the upper bit in the bit patterns corresponding to the four signal levels LV1 to LV4 illustrated in FIG. 2A, corresponds to the polarity of the signal, and is referred to as the polarity signal POL. It is possible to specify whether the signal level is LV1 or LV2, or is LV3 or LV4, based on the polarity indicated by the polarity signal POL.

In addition, as illustrated in FIG. 4, the LSB, which is the lower bit in the bit patterns corresponding to the four signal levels LV1 to LV4 illustrated in FIG. 2A, corresponds to an amplitude absolute value of the signal, and is referred to as an amplitude signal AMP. When the signal levels are specified as LV1 and LV2 by the polarity signal POL, it is possible to specify whether the signal level is LV1 or LV2 by the amplitude absolute value indicated by the amplitude signal AMP. When the signal level is specified as LV3 or LV4 by the polarity signal POL, it is possible to specify whether the signal level is LV3 or LV4 by the amplitude absolute value indicated by the amplitude signal AMP.

The edge sampler 201b samples a differential signal 'φDP–φDN' of data at the timing of a falling edge (negedge CLK1) of the clock signal CLK1 to generate an edge signal φEDG-1.

The data sampler 201c samples a differential signal 'φDP–φDN' of data at a falling edge timing (negedge CLK2) of a clock signal CLK2, and generates a polarity signal POL-1 and an amplitude signal AMP-1 corresponding to a value of data DATA-1.

For example, if an attention timing is the negedge CLK2, the negedge CLK1 is the timing before ¼ clock cycle of the attention timing, the posedge CLK2 is the timing before ½ clock cycle of the attention timing, and the posedge CLK1 is the timing before ¾ clock cycle of the attention timing.

Figure 5:
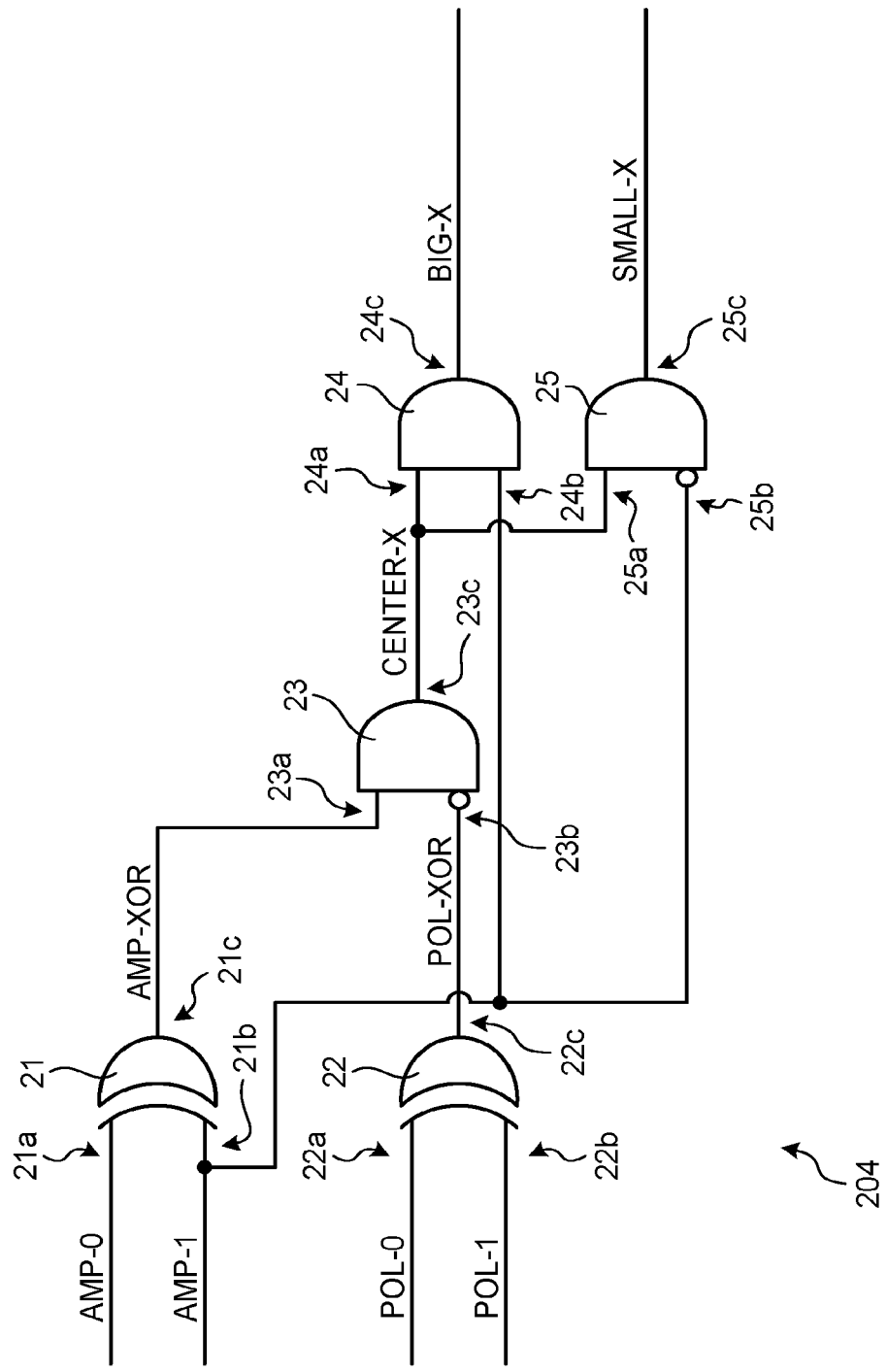
FIG. 5 is a diagram illustrating a configuration of a determination circuit in the receiving device according to an embodiment.

The signal generated at each clock timing illustrated in FIG. 4 is output to the determination circuit 204 in the logic circuit 202. The determination circuit 204 receives the amplitude signals AMP-0 and AMP-1 and the polarity signals POL-0 and POL-1 from the data sampler 201c, and generates the transition information BIG-X indicating the presence or absence of the transition edge of BIG-X and transition information SMALL-X indicating the presence or absence of the transition edge of SMALL-X. The configuration for generating the transition information BIG-X and the transition information SMALL-X in the determination circuit 204 is as illustrated in FIG. 5, for example. FIG. 5 is a diagram illustrating a configuration of the determination circuit 204 in the receiving device 200.

The determination circuit 204 has a plurality of logic gates 21 to 25. The plurality of logic gates 21 to 25 are arranged between the data sampler 201c and the estimation circuit 205.

The logic gate 21 has input nodes 21a and 21b and an output node 21c. The input node 21a is connected to the data sampler 201c via a particular delay circuit. A delay amount of the particular delay circuit corresponds to one clock cycle of the clock signal CLK. The input node 21a receives the amplitude signal AMP-0 from the data sampler 201c via the particular delay circuit. The input node 21b is connected to the data sampler 201c. The input node 21b receives the amplitude signal AMP-1 from the data sampler 201c. The output node 21c is connected to an input node 23a of the logic gate 23. The logic gate 21 is, for example, an exclusive OR gate, calculates an exclusive OR of the amplitude signal AMP-0 and the amplitude signal AMP-1, and outputs a calculation result AMP_XOR to the input node 23a of the logic gate 23.

The logic gate 22 has input nodes 22a and 22b and an output node 22c. The input node 22a is connected to the data sampler 201c via a particular delay circuit. A delay amount of the particular delay circuit corresponds to one clock cycle of the clock signal CLK. The input node 22a receives the polarity signal POL-0 from the data sampler 201c via the particular delay circuit. The input node 22b is connected to the data sampler 201c. The input node 22b receives the polarity signal POL-1 from the data sampler 201c. The output node 22c is connected to an input node 23b of the logic gate 23. The logic gate 22 is, for example, an exclusive OR gate, calculates an exclusive OR of the polarity signal POL-0 and the polarity signal POL-1, and outputs a calculation result POL_XOR to the input node 23b of the logic gate 23.

The logic gate 23 has input nodes 23a and 23b and an output node 23c. The input node 23a is connected to the output node 21c of the logic gate 21. The input node 23b is connected to the output node 22c of the logic gate 22. The output node 23c is connected to an input node 24a of the logic gate 24 and an input node 25a of the logic gate 25, respectively. The logic gate 23 is, for example, a logic gate that performs a second calculation for obtaining a logic product of a signal of the input node 23a and a logic inversion of the signal of the input node 23b. The logic gate 23 performs the second calculation on the calculation result AMP_XOR of the logic gate 21 and the calculation result POL_XOR of the logic gate 22, and outputs the result of the second calculation as transition information CENTER-X to the input node 24a of the logic gate 24 and the input node 25a of the logic gate 25, respectively.

The logic gate 24 has input nodes 24a and 24b and an output node 24c. The input node 24a is connected to the output node 23c of the logic gate 23. The logic gate 24 receives the transition information CENTER-X from the logic gate 23. The input node 24b is connected to the data sampler 201c. The logic gate 24 receives the amplitude signal AMP-1 from the data sampler 201c. The output node 24c is connected to the estimation circuit 205. The logic gate 24 is, for example, a logic product gate, calculates a logic product of the transition information CENTER-X and the amplitude signal AMP-1, and outputs the calculation result to the estimation circuit 205 as the transition information BIG-X.

The logic gate 25 has input nodes 25a and 25b and an output node 25c. The input node 25a is connected to the output node 23c of the logic gate 23. The logic gate 25 receives the transition information CENTER-X from the logic gate 23. The input node 25b is connected to the data sampler 201c. The logic gate 25 receives the amplitude signal AMP-1 from the data sampler 201c. The output node 25c is connected to the estimation circuit 205. The logic gate 25 is, for example, a logic gate that performs a third calculation for obtaining a logic product of a signal of the input node 25a and a logic inversion of a signal of the input node 25b, performs a third calculation on the transition information CENTER-X and the amplitude signal AMP-1, and outputs the calculation result to the estimation circuit 205 as the transition information SMALL-X.

The operation of the circuit illustrated in FIG. 5 is illustrated in a truth table as illustrated in FIG. 6. FIG. 6 is a diagram illustrating an operation of the determination circuit 204 in the receiving device 200. In FIG. 6, a combination of the polarity signal POL-0 and amplitude signal AMP-0 corresponding to the data DATA-0 obtained at the timing illustrated in FIG. 4, and the polarity signal POL-1 and amplitude signal AMP-1 corresponding to the data DATA-1 is illustrated. In addition, operation results AMP_XOR and POL_XOR, and the transition information CENTER-X, BIG-X, and SMALL-X generated by the determination circuit 204 are illustrated accordingly.

For example, the transition information BIG-X is 1 (BIG-X=1) when the value of the data DATA makes transition from 0 to 3 (0→3) or from 3 to 0 (3→0), and the transition information BIG-X is 0 (BIG-X=0) when the value of the data DATA indicates other transitions. This indicates that the transition information BIG-X is information indicating the presence or absence of BIG-X.

In addition, the transition information SMALL-X is 1 (SMALL-X=1) when the value of the data DATA makes transition from 1 to 2 (1→2) or from 2 to 1 (2→1), and the transition information SMALL-X is 0 (SMALL-X=0) when the value of the data DATA indicates other transitions. This indicates that the transition information SMALL-X is information indicating the presence or absence of SMALL-X.

Although not specifically illustrated, the determination circuit 204 performs the phase determination of the clock signal CLK by the operation illustrated in FIG. 7 and generates phase determination information (EARLY, LATE). FIG. 7 is a diagram illustrating an operation of the determination circuit 204 in the receiving device 200.

For example, the determination circuit 204 determines that the transition edge of the clock signal CLK is delayed with respect to the transition edge of the data signal φDP according to a signal group (φEDG-0, POL-0, φEDG-1)=(0, 0, 1) for the edge signal φEDG-0, the polarity signal POL-0, and the edge signal φEDG-1 (see FIG. 4). The determination circuit 204 generates phase determination information (EARLY, LATE)=(0, 1) according to the determination result of the delay phase and outputs the generated phase determination information to the estimation circuit 205 and the CDR circuit 203.

Alternatively, the determination circuit 204 determines that the transition edge of the clock signal CLK is delayed with respect to the transition edge of the data signal φDP according to a signal group (φEDG-0, POL-0, φEDG-1)= (1,1,0). The determination circuit 204 generates phase determination information (EARLY, LATE)=(0, 1) according to the determination result of the delay phase and outputs the generated phase determination information to the estimation circuit 205 and the CDR circuit 203.

Alternatively, the determination circuit 204 determines that the transition edge of the clock signal CLK is advanced with respect to the transition edge of the data signal φDP according to a signal group (φEDG-0, POL-0, φEDG-1)= (0,1,1). The determination circuit 204 generates phase determination information (EARLY, LATE)=(1,0) according to the determination result of the advance phase and outputs the generated phase determination information to the estimation circuit 205 and the CDR circuit 203.

Alternatively, the determination circuit 204 determines that the transition edge of the clock signal CLK is advanced with respect to the transition edge of the data signal φDP according to a signal group (φEDG-0, POL-0, φEDG-1)= (1,0,0). The determination circuit 204 generates phase determination information (EARLY, LATE)=(1,0) according to the determination result of the advance phase and outputs the generated phase determination information to the estimation circuit 205 and the CDR circuit 203.

Alternatively, the determination circuit 204 does not determine whether the phase is advanced or delayed according to the pattern of other values of the signal groups (φEDG-0, POL-0, φEDG-1). The determination circuit 204 generates phase determination information (EARLY, LATE) =(0, 0) of a default value according to the fact that the determination is not performed (that is, no determination) and outputs the generated phase determination information to the estimation circuit 205 and the CDR circuit 203.

When the CDR circuit 203 receives the phase determination information (EARLY, LATE)=(0, 0) of the default value, the CDR circuit 203 maintains the currently generated clock signal CLK without performing the phase adjustment.

Figure 8:
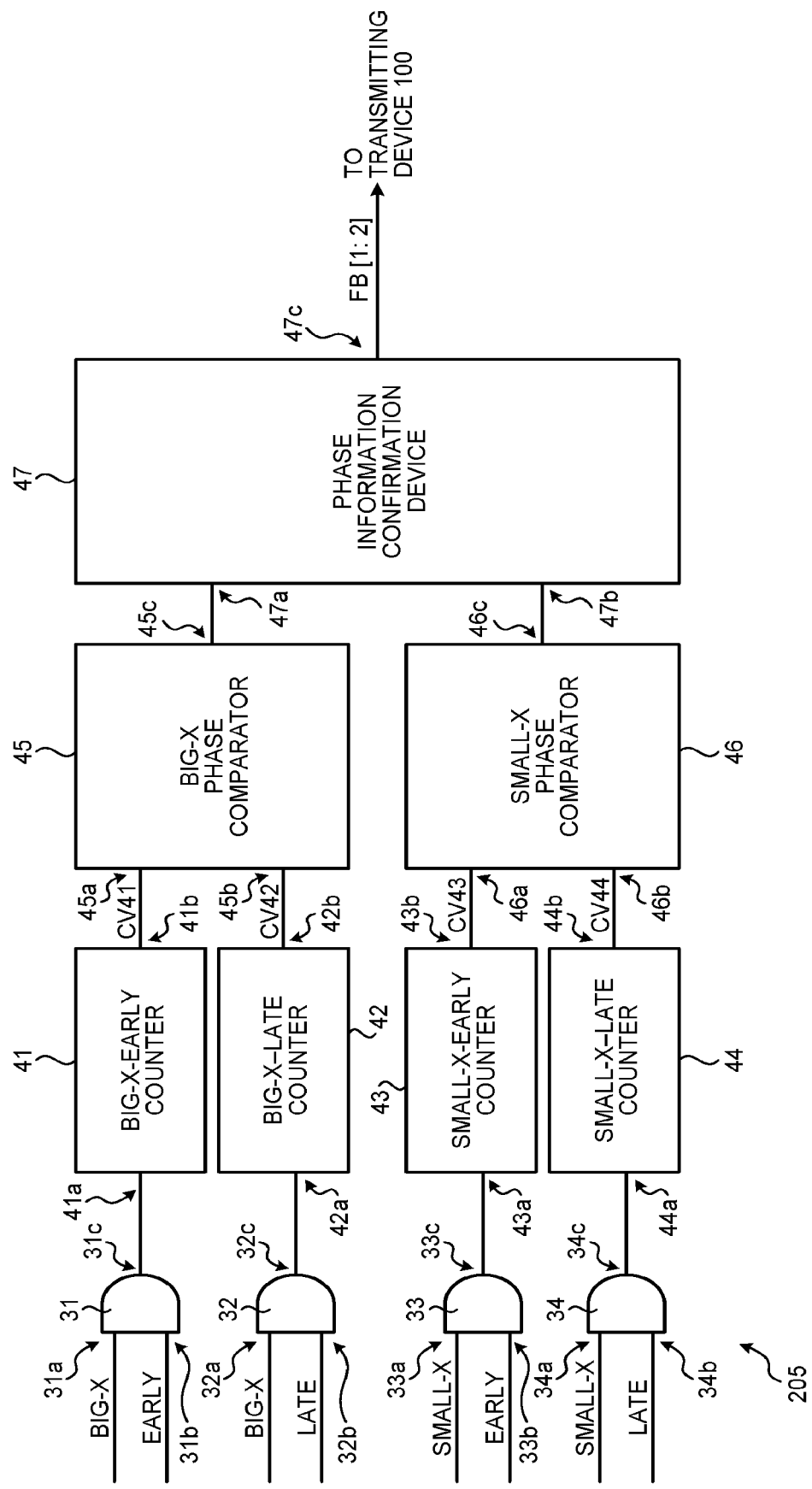
FIG. 8 is a diagram illustrating a configuration of an estimation circuit in the receiving device in the embodiment.

When the transition information BIG-X and SMALL-X illustrated in FIG. 6 and the phase determination information (EARLY, LATE) illustrated in FIG. 7 are input, the estimation circuit 205 estimates the deviation $\Delta t_{BS}$ between the timing $t_B$ of BIG-X and the timing $t_S$ of SMALL-X according to the transition information BIG-X, the transition information SMALL-X, and the phase determination information (EARLY, LATE). That is, the estimation circuit 205 generates first probability information and second probability information. The first probability information is information indicating a ratio between the probability of being determined to be the advanced phase and the probability of being determined to be the delayed phase when the phase of the clock signal CLK is determined at the timing of the transition edge of BIG-X. The second probability information is information indicating a ratio between the probability of being determined to be the advanced phase and the probability of being determined to be the delayed phase when the phase of the clock signal CLK is determined at the timing of the transition edge of SMALL-X. The estimation circuit 205 estimates the deviation $\Delta t_{BS}$ according to the first probability information and the second probability information. The estimation circuit 205 generates control information FB[1:2] for adjusting the deviation $\Delta t_{BS}$ according to the estimation result of the deviation $\Delta t_{BS}$, and feeds back the control information FB[1:2] to the transmitting device 100. The estimation circuit 205 can be configured as illustrated in FIG. 8. FIG. 8 is a diagram illustrating a configuration of the estimation circuit 205 in the receiving device 200.

The estimation circuit 205 includes a plurality of logic gates 31 to 34, a BIG-X-EARLY counter 41, a BIG-X-LATE counter 42, a SMALL-X-EARLY counter 43, a SMALL-X-LATE counter 44, a BIG-X phase comparator 45, a SMALL-X phase comparator 46, and a phase information confirmation device 47. The logic gates 31 and 32 configure a logic gate group corresponding to the transition information BIG-X, and the logic gates 33 and 34 configure a logic gate group corresponding to the transition information BIG-X. The BIG-X-EARLY counter 41 and the BIG-X-LATE counter 42 configure a counter group corresponding to the transition information BIG-X, and the SMALL-X-EARLY counter 43 and the SMALL-X-LATE counter 44 configure a counter group corresponding to the transition information SMALL-X.

The logic gate 31 has input nodes 31a and 31b and an output node 31c. The input node 31a and the input node 31b are connected to the determination circuit 204, respectively. The input node 31a receives the transition information BIG-X from the determination circuit 204, and the input node 31b receives the phase determination information EARLY from the determination circuit 204. The output node 31c is connected to an input node 41a of the BIG-X-EARLY counter 41. The logic gate 31 is, for example, a logic product gate, calculates a logic product of the transition information BIG-X and the phase determination information EARLY, and outputs the calculation result to the input node 41a of the BIG-X-EARLY counter 41. The calculation result is a signal that selectively becomes an active level "1" when the transition edge of BIG-X exists and the result of the phase determination is EARLY=1.

The BIG-X-EARLY counter 41 has an input node 41a and an output node 41b. The input node 41a is connected to the output node 31c of the logic gate 31. The BIG-X-EARLY counter 41 counts the number of times that the operation result of the logic gate 31 becomes the active level "1" in a certain period (for example, a period from a start of operation to a reset). A count value CV41 of the BIG-X-EARLY counter 41 indicates the number of times the phase is determined to be advanced when the phase of the clock signal CLK is determined at the timing of the transition edge of the BIG-X within the certain period. The output node 41b is connected to an input node 45a of the BIG-X phase comparator 45. The BIG-X-EARLY counter 41 outputs the count value CV41 to the input node 45a of the BIG-X phase comparator 45 at an end timing of the certain period or the like.

The logic gate 32 has input nodes 32a and 32b and an output node 32c. The input node 32a and the input node 32b are connected to the determination circuit 204, respectively. The input node 32a receives the transition information BIG-X from the determination circuit 204, and the input node 32b receives the phase determination information LATE from the determination circuit 204. The output node 32c is connected to an input node 42a of the BIG-X-LATE counter 42. The logic gate 32 is, for example, a logic product gate, calculates a logic product of the transition information BIG-X and the phase determination information LATE, and outputs the calculation result to the input node 42a of the BIG-X-LATE counter 42. The calculation result is a signal that selectively becomes the active level "1" when the transition edge of BIG-X exists and the result of the phase determination is LATE=1.

The BIG-X-LATE counter 42 has an input node 42a and an output node 42b. The input node 42a is connected to the output node 32c of the logic gate 32. The BIG-X-LATE counter 42 counts the number of times that the operation result of the logic gate 32 becomes the active level "1" in a certain period (for example, a period from a start of operation to a reset). A count value CV42 of the BIG-X-LATE counter 42 indicates the number of times the phase is determined to be delayed when the phase of the clock signal CLK is determined at the timing of the transition edge of BIG-X within the certain period. The output node 42b is connected to an input node 45b of the BIG-X phase comparator 45. The BIG-X-LATE counter 42 outputs the count value CV42 to the input node 45b of the BIG-X phase comparator 45 at an end timing of the certain period or the like.

The BIG-X phase comparator 45 has an input node 45a, an input node 45b, and an output node 45c. The input node 45a is connected to the BIG-X-EARLY counter 41, and the input node 45b is connected to the BIG-X-LATE counter 42. When the BIG-X phase comparator 45 receives the count value CV41 from the BIG-X-EARLY counter 41 and the count value CV42 from the BIG-X-LATE counter 42, the BIG-X phase comparator 45 performs a calculation illustrated in the following Equation 1 to obtain an EARLY_LATE rate $R_{BIG-X}$ of BIG-X.

$$R_{BIG-X}=(CV41-CV42)/(CV41+CV42) \quad \text{Equation 1}$$

As illustrated in Equation 1, the EARLY_LATE rate $R_{BIG-X}$ of BIG-X illustrates a ratio between the probability of being determined to be advanced (EARLY=1) and the probability of being determined to be delayed (LATE=1) when the phase determination of the clock signal CLK is performed at the timing of the transition edge of BIG-X. If the probability of being determined to be advanced is 100%, $R_{BIG-X}$=+1, if the probability of being determined to be delayed is 100%, $R_{BIG-X}$=-1, and if the probability of being determined to be advanced and the probability of being determined to be delayed are 50%, respectively, $R_{BIG-X}$=0. The BIG-X phase comparator 45 outputs the EARLY_LATE ratio $R_{BIG-X}$ of BIG-X to the phase information confirmation device 47. Note that the BIG-X phase comparator 45 may reset the BIG-X-EARLY counter 41 and the BIG-X-LATE counter 42, respectively, according to the EARLY_LATE ratio $R_{BIG}$-X of the BIG-X being obtained.

The logic gate 33 has input nodes 33a and 33b and an output node 33c. The input node 33a and the input node 33b are connected to the determination circuit 204, respectively. The input node 33a receives the transition information SMALL-X from the determination circuit 204, and the input node 33b receives the phase determination information EARLY from the determination circuit 204. The output node 33c is connected to an input node 43a of the SMALL-X-EARLY counter 43. The logic gate 33 is, for example, a logic product gate, calculates a logic product of the transition information SMALL-X and the phase determination information EARLY, and outputs the calculation result to the input node 43a of the SMALL-X-EARLY counter 43. This calculation result is a signal that selectively becomes the active level "1" when the transition edge of SMALL-X exists and the result of the phase determination is EARLY=1.

The SMALL-X-EARLY counter 43 has an input node 43a and an output node 43b. The input node 43a is connected to the output node 33c of the logic gate 33. The SMALL-X-EARLY counter 43 counts the number of times that the operation result of the logic gate 33 becomes the active level "1" in a certain period (for example, a period from a start of operation to a reset). A count value CV43 of the SMALL-X-EARLY counter 43 indicates the number of times the phase is determined to be advanced when the phase of the clock signal CLK is determined at the transition edge timing of the SMALL-X within a certain period. The output node 43b is connected to an input node 46a of the SMALL-X phase comparator 46. The SMALL-X-EARLY counter 43 outputs the count value CV43 to the input node 46a of the SMALL-X phase comparator 46 at an end timing of the certain period or the like.

The logic gate 34 has input nodes 34a and 34b and an output node 34c. The input node 34a and the input node 34b are connected to the determination circuit 204, respectively. The input node 34a receives the transition information SMALL-X from the determination circuit 204, and the input node 34b receives the phase determination information LATE from the determination circuit 204. The output node 34c is connected to an input node 44a of the SMALL-X-LATE counter 44. The logic gate 34 is, for example, a logic product gate, calculates a logic product of the transition information SMALL-X and the phase determination information LATE, and outputs the calculation result to the input node 44a of the SMALL-X-LATE counter 44. The calculation result is a signal that selectively becomes the active level "1" when the transition edge of SMALL-X exists and the result of the phase determination is LATE=1.

The SMALL-X-LATE counter 44 has an input node 44a and an output node 44b. The input node 44a is connected to the output node 34c of the logic gate 34. The SMALL-X-LATE counter 44 counts the number of times that the calculation result of the logic gate 34 becomes the active level "1" in a certain period (for example, a period from a start of operation to a reset). A count value CV44 of the SMALL-X-LATE counter 44 indicates the number of times the phase is determined to be delayed when the phase of the clock signal CLK is determined at the transition edge timing of the SMALL-X within the certain period. The output node 44b is connected to an input node 46b of the SMALL-X phase comparator 46. The SMALL-X-LATE counter 44 outputs the count value CV44 to the input node 46b of the SMALL-X phase comparator 46 at the end timing of the certain period or the like.

The SMALL-X phase comparator 46 has an input node 46a, an input node 46b, and an output node 46c. The input node 46a is connected to the SMALL-X-EARLY counter 43, and the input node 46b is connected to the SMALL-X-LATE counter 44. When the SMALL-X phase comparator 46 receives the count value CV43 from the SMALL-X-EARLY counter 43 and the count value CV44 from the SMALL-X-LATE counter 44, the SMALL-X phase comparator 46 performs a calculation illustrated in the following Equation 2 to obtain an EARLY_LATE rate $R_{SMALL-x}$ of SMALL-X.

$$R_{SMALL-X}=(CV43-CV44)/(CV43+CV44) \quad \text{Equation 2}$$

As illustrated in Equation 2, the EARLY_LATE rate $R_{SMALL-X}$ of SMALL-X illustrates a ratio between the probability of being determined to be advanced (EARLY=1) and the probability of being determined to be delayed (LATE=1) when the phase determination of the clock signal CLK is performed at the timing of the transition edge of SMALL-X. If the probability of being determined to be advanced is 100%, $R_{SMALL-X}=+1$, if the probability of being determined to be delayed is 100%, $R_{SMALL-X}=-1$, and if the probability of being determined to be advanced and the probability of being determined to be delayed are 50%, respectively, $R_{SMALL-X}=0$. The SMALL-X phase comparator 46 outputs the EARLY_LATE ratio $R_{SMALL-X}$ of SMALL-X to the phase information confirmation device 47. Note that the SMALL-X phase comparator 46 may reset the SMALL-X-EARLY counter 43 and the SMALL-X-LATE counter 44 according to the EARLY_LATE ratio $R_{SMALL-X}$ of SMALL-X being obtained.

The phase information confirmation device 47 has an input node 47a, an input node 47b, and an output node 47c. The input node 47a is connected to the BIG-X phase comparator 45, and the input node 46b is connected to the SMALL-X phase comparator 46. The phase information confirmation device 47 receives the BIG-X EARLY_LATE ratio $R_{BIG-X}$ from the BIG-X phase comparator 45, and receives the SMALL-X EARLY_LATE ratio $R_{SMALL-X}$ from the SMALL-X phase comparator 46. The phase information confirmation device 47 estimates the deviation $\Delta t_{BS}$ between the BIG-X timing $t_B$ and the SMALL-X timing $t_S$ according to the BIG-X EARLY_LATE ratio $R_{BIG-X}$ and SMALL-X EARLY_LATE ratio $R_{SMALL-X}$.

For example, the phase information confirmation device 47 accumulates the EARLY_LATE rate $R_{BIG-X}$ of BIG-X and the EARLY_LATE rate $R_{SMALL-X}$ of SMALL-X, respectively, for a plurality of different clock timings, and plots the accumulated EARLY_LATE rates on a coordinate plane illustrated in FIG. 9A. FIGS. 9A to 9C are diagrams for explaining an operation of the estimation circuit 205 in the receiving device 200. 1UI is a unit interval of waveform processing and corresponds to one cycle of the clock CLK. In FIGS. 9A to 9C, changes in the BIG-X EARLY_LATE ratio $R_{BIG-X}$ according to a time position of the clock timing are illustrated by a solid line, and changes in the SMALL-X EARLY_LATE ratio $R_{SMALL-X}$ according to the time position of the clock timing are illustrated by a dotted line. FIGS. 9A to 9C illustrate coordinate planes with the EARLY_LATE rate as a vertical axis and the time position within 1 unit interval (UI) of the clock timing as a horizontal axis.

In the case of FIG. 9A, if the clock timing is within a period of 0 to $t_{B1}$ or within a period of $t_{S1}$ to $t_E$ within the 1UI, both the solid line and the dotted line have the same polarity value, and therefore the result of the phase determination by the determination circuit 204 is relatively stable, and the CDR circuit 203 may stably adjust the phase. On the other hand, if the clock timing is within a period of $t_{B1}$ to $t_{S1}$ within the 1UI, the solid line and the dotted line have different polarities, and therefore the result of the phase determination by the determination circuit 204 varies and the phase adjustment of the CDR circuit 203 becomes unstable. The period from $t_{B1}$ to $t_{S1}$ is called an indefinite section in the sense that the result of the phase determination is not fixed. It is considered that the indefinite section $t_{B1}$ to $t_{S11}$ corresponds to the deviation $\Delta t_{BS}$ between the timing $t_B$ of BIG-X and the timing $t_S$ of SMALL-X.

Therefore, the phase information confirmation device 47 obtains a time length $\Delta t_{BS1}$ of the indefinite section $t_{B1}$ to $t_{S1}$. In the phase information confirmation device 47, adjustment information indicating a relationship between the time length of the indefinite section and a control object and a control amount to be adjusted with respect thereto is experimentally determined and set in advance. That is, the estimation circuit 205 has the adjustment information. The control object to be adjusted includes at least one of the MSB transmission path and the LSB transmission path in the transmitting device 100. The control amount to be adjusted includes a delay amount to be adjusted in the MSB transmission path when the control object is the MSB transmission path, includes a delay amount to be adjusted in the LSB transmission path when the control object is the LSB transmission path, and includes the delay amount to be adjusted in the MSB transmission path and the delay amount to be adjusted in the LSB transmission path when the control object is the MSB transmission path and the LSB transmission path. That is, the phase information confirmation device 47 estimates the time length $\Delta t_{BS1}$ of the indefinite section $t_{B1}$ to $t_{S1}$ as information indicating the deviation $\Delta t_{BS}$ between the BIG-X timing $t_B$ and the SMALL-X timing $t_S$.

The phase information confirmation device 47, when the time length $\Delta t_{BS1}$ is obtained, refers to the adjustment information to determine the control object and the control amount, and generates a control signal FB[1:2] indicating the control object and the control amount to be adjusted by the transmitting device 100 according to the determination result. The control signal FB[1] is a control signal for MSB, and the control signal FB[2] is a control signal for LSB. The phase information confirmation device 47 feeds back the control signal FB[1:2] to the timing adjustment circuit 103 of the transmitting device 100.

Figure 10A:
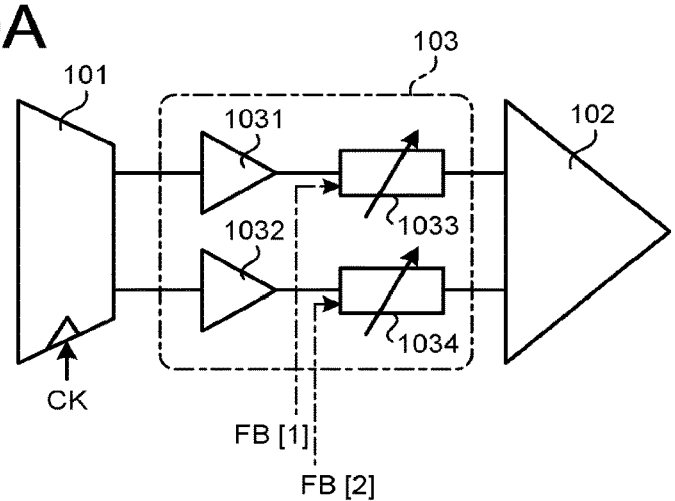
FIGS. 10A to 10C are diagrams illustrating configurations of a respective timing adjustment circuit in a transmitting device according to the embodiment, a first modified example, and a second modified example.

The timing adjustment circuit 103 adjusts a signal timing based on the control signal FB[1:2]. That is, the timing adjustment circuit 103 adjusts a delay amount of at least one of the MSB transmission path and the LSB transmission path based on the control signal FB[1:2]. The timing adjustment circuit 103 may be configured as illustrated in FIG. 10A. FIG. 10A is a diagram illustrating an example of a configuration of the timing adjustment circuit 103.

In the transmitting device 100, a buffer amplifier 1031 and a variable delay circuit 1033 are sequentially arranged on the MSB transmission path from the serializer 101 to the driver 102, and a buffer amplifier 1032 and a variable delay circuit 1034 are sequentially arranged on the LSB transmission path from the serializer 101 to the driver 102. The variable delay circuit 1033 is electrically connected between the buffer amplifier 1031 and the driver 102. The variable delay circuit 1033 receives the control signal FB[1] at a control node thereof and adjusts a delay amount by the control amount indicated by the control signal FB[1]. The variable delay circuit 1033 adds the delay amount after adjustment to the signal (MSB) received from buffer amplifier 1031 and outputs to driver 102 the signal to which the delay amount is added. The variable delay circuit 1034 is electrically connected between the buffer amplifier 1032 and the driver 102. The variable delay circuit 1034 receives the control signal FB[2] at a control node thereof and adjusts a delay amount by the control amount indicated by the control signal FB[2]. The variable delay circuit 1034 adds the delay amount after adjustment to the signal (LSB) received from buffer amplifier 1032 and outputs to driver 102 the signal to which the delay amount is added.

In the transmitting device 100, the transmission data φTX is serialized into a bit pattern by a serializer 101 according to a particular procedure, and the serialized bit pattern is passed through a timing adjustment circuit 103 and pulse-amplitude modulated by the driver 102. The driver 102 transmits the modulation signal to the receiving device 200 via the wired transmission path 300.

The signal after adjustment is received by the receiving device 200 from the transmitting device 100 through the wired communication path 300. The determination circuit 204 of the semiconductor integrated circuit 1 regenerates the transition information BIG-X, the transition information SMALL-X, and the phase determination information (EARLY, LATE) for the signal level of the received modulation signal after adjustment. The estimation circuit 205 of the semiconductor integrated circuit 1 again obtains the EARLY_LATE rate $R_{BIG-X}$ of BIG-X and the EARLY_LATE rate $R_{SMALL-X}$ of SMALL-X according to the transition information BIG-X, the transition information SMALL-X, and the phase determination information (EARLY, LATE). The estimation circuit 205 accumulates the EARLY_LATE rate $R_{BIG-X}$ of BIG-X and the EARLY_LATE rate $R_{SMALL-X}$ of SMALL-X, respectively, for a plurality of different clock timings, and plots the accumulated EARLY_LATE rates on a coordinate plane illustrated in FIG. 9B. As a result, the phase information confirmation device 47 of the estimation circuit 205 estimates a time length $\Delta t_{BS2}$ of an indefinite section $t_{B2}$ to $t_{S2}$ as information indicating the deviation $\Delta t_{BS}$ between the BIG-X timing $t_B$ and the SMALL-X timing $t_S$.

In the case of FIG. 9B, it is considered that the time length $\Delta t_{BS2}$ of the indefinite section $t_{B2}$ to $t_{S2}$ is smaller than that in the case of FIG. 9A ($\Delta t_{BS2} < \Delta t_{BS1}$), and the deviation $\Delta t_{BS}$ between the BIG-X timing $t_B$ and the SMALL-X timing $t_S$ is reduced.

The phase information confirmation device 47, when the time length $\Delta t_{BS2}$ is obtained, refers to the adjustment information to determine the control object and the control amount, and again generates the control signal FB[1:2] indicating the control object and the control amount to be adjusted by the transmitting device 100 according to the determination result. The phase information confirmation device 47 feeds back the control signal FB[1:2] to the timing adjustment circuit 103 of the transmitting device 100 again.

The timing adjustment circuit 103 performs signal timing adjustment again based on the control signal FB[1:2]. That is, the timing adjustment circuit 103 adjusts the delay amount of at least one of the variable delay circuit 1033 and the variable delay circuit 1034 with the control amount indicated by the control signal FB based on the control signal FB[1:2].

In the transmitting device 100, the bit pattern obtained by serializing the transmission data φTX by the serializer 101 is passed through the timing adjustment circuit 103 and pulse-amplitude modulated by the driver 102. The driver 102 transmits the modulation signal to the receiving device 200 via the wired transmission path 300.

The signal after adjustment is received by the receiving device 200 from the transmitting device 100 through the wired communication path 300. The determination circuit 204 of the semiconductor integrated circuit 1 regenerates the transition information BIG-X, the transition information SMALL-X, and the phase determination information (EARLY, LATE) for the signal level of the received modulation signal after adjustment. The estimation circuit 205 of the semiconductor integrated circuit 1 again obtains the EARLY_LATE rate $R_{BIG-X}$ of BIG-X and the EARLY_LATE rate $R_{SMALL-X}$ of SMALL-X according to the transition information BIG-X, the transition information SMALL-X, and the phase determination information (EARLY, LATE). The estimation circuit 205 accumulates the EARLY_LATE rate $R_{BIG-X}$ of BIG-X and the EARLY_LATE rate $R_{SMALL-X}$ of SMALL-X, respectively, for a plurality of different clock timings, and plots the accumulated EARLY_LATE rates on a coordinate plane illustrated in FIG. 9C. As a result, the phase information confirmation device 47 of the estimation circuit 205 estimates a time length $\Delta t_{BS3}$ of an indefinite section $t_{B3}$ to $t_{S3}$ as information indicating the deviation $\Delta t_{BS}$ between the BIG-X timing $t_B$ and the SMALL-X timing $t_S$.

In the case of FIG. 9C, it is considered that the time length $\Delta t_{BS3}$ of the indefinite section $t_{B3}$ to $t_{S3}$ is smaller than that in the case of FIG. 9B ($\Delta t_{BS3} < \Delta t_{BS2}$), and the deviation $\Delta t_{BS}$ between the BIG-X timing $t_B$ and the SMALL-X timing $t_S$ is further reduced. That is, if the time length $\Delta t_{BS3}$ of the indefinite section $t_{B3}$ to $t_{S3}$ is within an allowable range, the semiconductor integrated circuit 1 determines that the deviation $\Delta t_{BS}$ between the BIG-X timing $t_B$ and the SMALL-X timing $t_S$ is within the allowable range. Assuming that it is within the range, and ends the process of estimating the deviation $\Delta t_{BS}$ and generating the control signal FB.

As described above, in the present embodiment, in the receiving device 200, the semiconductor integrated circuit 1 detects the deviation $\Delta t_{BS}$ between the timing of BIG-X and the timing of SMALL-X, and feeds back the control signal FB for adjusting the deviation $\Delta t_{BS}$ to the transmitting device 100. With this operation, the timing adjustment circuit 103 of the transmitting device 100 performs timing adjustment based on the control signal FB, and a signal having a smaller deviation $\Delta t_{BS}$ between the BIG-X timing $t_B$ and the SMALL-X timing $t_S$ may be received by the receiving device 200. With this operation, the accuracy of the phase determination information (EARLY, LATE) generated by the receiving device 200 may be improved. As a result, the clock signal CLK may be properly regenerated according to the phase determination information (EARLY, LATE) for the modulation signal after adjustment. That is, the jitter characteristics of the regenerated clock signal CLK may be improved.

Figure 10B:
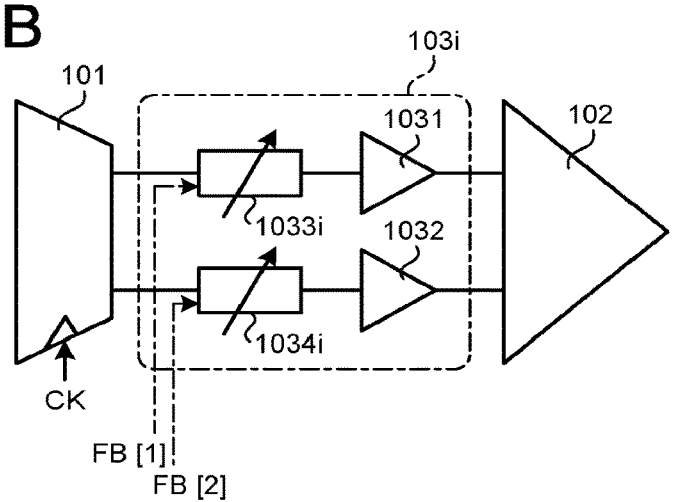

It should be noted that, as illustrated in FIG. 10B, in the timing adjustment circuit 103*i*, a variable delay circuit 1033*i* may be electrically connected between the serializer 101 and the buffer amplifier 1031, and a variable delay circuit 1034*i* may be electrically connected between the serializer 101 and the buffer amplifier 1032. FIG. 10B is a diagram illustrating a configuration of the timing adjustment circuit 103*i* in the transmitting device 100 according to a first modified example of the embodiment. The variable delay circuit 1033*i* adds a delay amount after adjustment to the signal (MSB) received from the serializer 101 and outputs to the buffer amplifier 1031 the signal to which the delay amount after adjustment is added. The variable delay circuit 1034*i* adds a delay amount after adjustment to the signal (LSB) received from the serializer 101 and outputs to the buffer amplifier 1032 the signal to which the delay amount after adjustment is added. Also with such a configuration, the timing adjustment may be performed on the transmitting device 100 side so that the deviation $\Delta t_{BS}$ between the BIG-X timing and the SMALL-X timing is reduced.

Figure 10C:
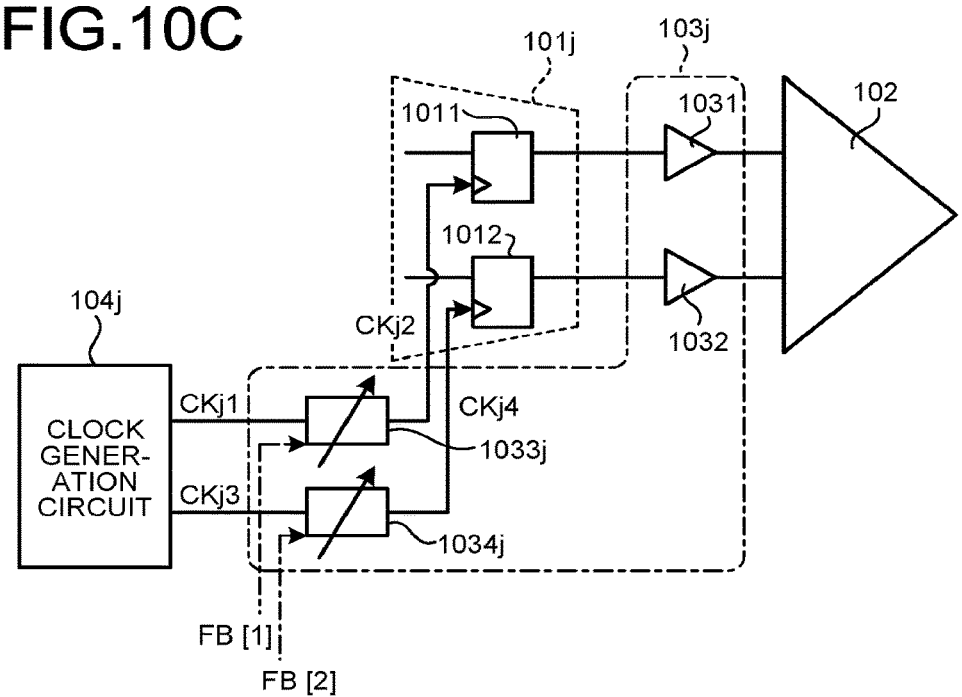

Alternatively, as illustrated in FIG. 10C, in the timing adjustment circuit 103*j*, a variable delay circuit 1033*j* and a variable delay circuit 1034*j* may be electrically connected between a clock generation circuit 104*j* and a serializer 101*j*, respectively. FIG. 10C is a diagram illustrating a configuration of the timing adjustment circuit 103*j* in the transmitting device 100 according to a second modified example of the embodiment. The serializer 101*j* has a flip-flop 1011 and a flip-flop 1012. The variable delay circuit 1033*j* is electrically connected between the clock generation circuit 104*j* and a clock node of the flip-flop 1011. The variable delay circuit 1033*j* outputs a clock signal CKj2, which is obtained by adding a delay amount after adjustment to the clock signal CKj1 received from the clock generation circuit 104*j*, to the clock node of the flip-flop 1011. As a result, the flip-flop 1011 transmits the signal (MSB) received at the data input node to the buffer amplifier 1031 in synchronization with the clock signal CKj2 to which the delay amount after adjustment is added. The variable delay circuit 1034*j* is electrically connected between the clock generation circuit 104*j* and the clock node of the flip-flop 1012. The variable delay circuit 1034*j* outputs a clock signal CKj4, which is obtained by adding a delay amount after adjustment to the clock signal CKj3 received from the clock generation circuit 104*j*, to the clock node of the flip-flop 1012. As a result, the flip-flop 1012 transmits the signal (LSB) received at the data input node to the buffer amplifier 1032 in synchronization with the clock signal CKj4 to which the delay amount after adjustment is added. Also with such a configuration, the timing adjustment may be performed on the transmitting device 100 side so that the deviation $\Delta t_{BS}$ between the BIG-X timing and the SMALL-X timing is reduced.

Figure 11A:
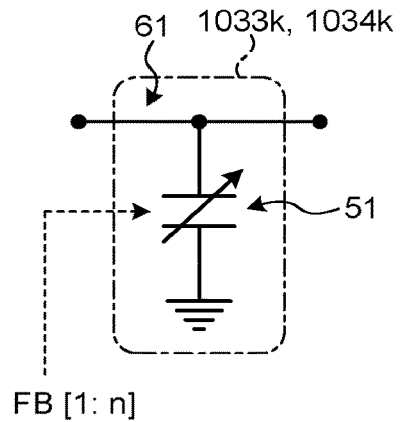
FIGS. 11A to 11C are diagrams illustrating configurations of a variable delay circuit in a transmitting device according to a third modified example of the embodiment.
Figure 11B:
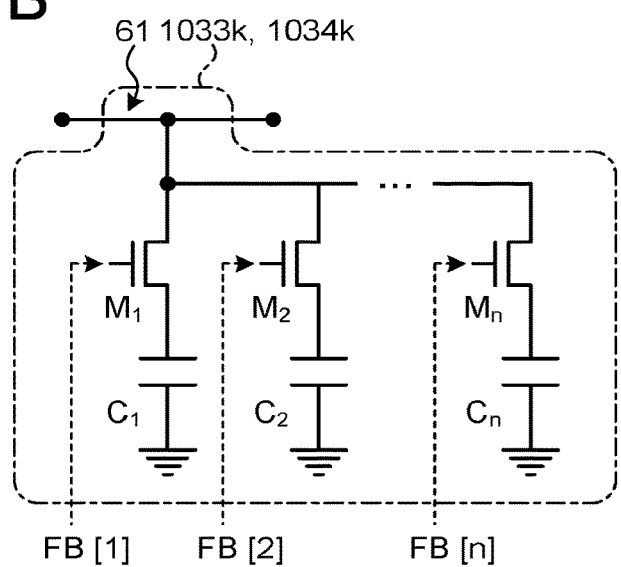
Figure 11C:
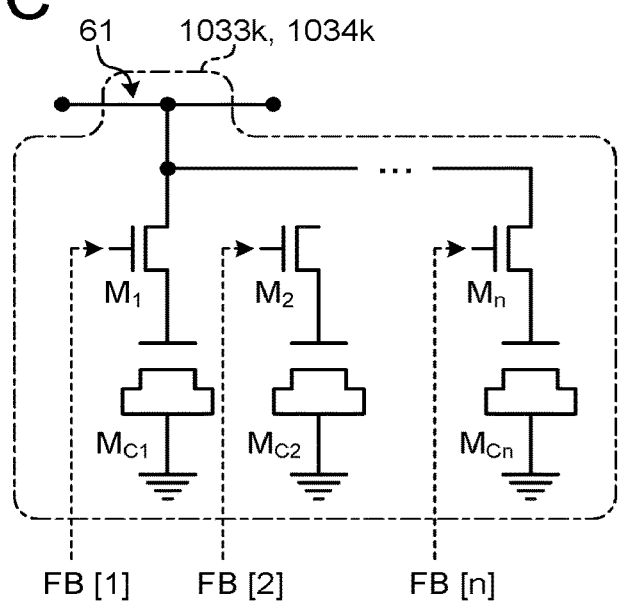

Alternatively, variable delay circuits 1033*k* and 1034*k* used in the timing adjustment circuit may be configured as illustrated in FIGS. 11A to 11C. FIGS. 11A to 11C are diagrams illustrating configurations of the variable delay circuits 1033*k* and 1034*k* in the transmitting device 100 according to a third modified example of the embodiment. FIG. 11A illustrates a configuration in which a variable capacitance circuit 51 is connected to a line 61 that connects an input node and an output node of the variable delay circuits 1033*k* and 1034*k*. The variable capacitance circuit 51 has one terminal electrically connected to the line 61 and the other terminal electrically connected to a ground potential, and a capacitance value thereof can be adjusted according to, for example, an n-bit control signal FB[1:n]. 'n' is an arbitrary integer of 2 or more.

The variable capacitance circuit 51 illustrated in FIG. 11A may be realized by the circuit illustrated in FIG. 11B, for example. In the circuit illustrated in FIG. 11B, series connections of n transistors $M_1$ to $M_n$ and n capacitive elements $C_1$ to $C_n$ are connected in parallel between the line 61 and the ground potential. Each of the transistors $M_1$ to $M_n$ is, for example, an NMOS transistor, receives the control signal FB at a gate, has a source connected to the capacitive elements $C_1$ to $C_n$, and has a drain connected to the line 61. The capacitive elements $C_1$ to $C_n$ have one terminal connected to the sources of the transistors $M_1$ to $M_n$ and the other terminal connected to the ground potential. In the configuration, depending on which control signal FB[1:n] of the n-bit control signal FB[1:n] is set to the active level, the transistor that is turned on among the plurality of transistors $M_1$ to $M_n$ is changed, and the capacitive elements $C_1$ to $C_n$ activated between the line 61 and the ground potential are changed. As a result, the capacitance values of the variable delay circuits 1033*k* and 1034*k* may be adjusted according to the n-bit control signal FB[1:n].

Further, in the circuit illustrated in FIG. 11B, the capacitive elements $C_1$ to $C_n$ may be realized by the transistors $M_{C1}$ to $M_{Cn}$. The gates of the transistors $M_{C1}$ to $M_{Cn}$ are connected to the sources of the transistors $M_1$ to $M_n$, the sources and drains thereof are connected to each other, and are connected to the ground potential.

Figure 12A:
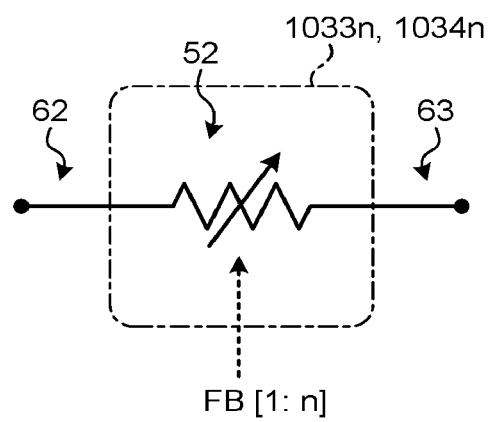
FIGS. 12A and 12B are diagrams illustrating configurations of a variable delay circuit in a transmitting device according to a fourth modified example of the embodiment.
Figure 12B:
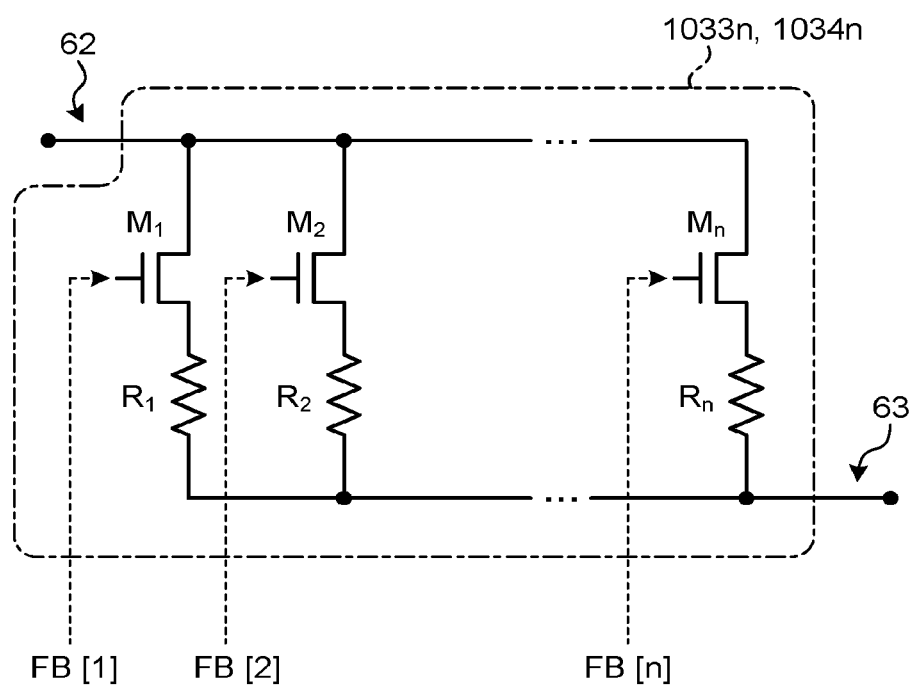

Alternatively, variable delay circuits 1033*n* and 1034*n* used in the timing adjustment circuit may be configured as illustrated in FIGS. 12A and 12B. FIGS. 12A and 12B are diagrams illustrating configurations of the variable delay circuits 1033*n* and 1034*n* in the transmitting device 100 according to a fourth modified example of the embodiment. FIG. 12A illustrates a configuration in which a variable resistance circuit 52 is connected between a line 62 on an input node side and a line 63 on an output node side of the variable delay circuits 1033*n* and 1034*n*. The variable resistance circuit 52 has one terminal electrically connected to the line 62 and the other terminal electrically connected to the line 63, and a resistance value thereof may be adjusted according to, for example, an n-bit control signal FB[1:n]. 'n' is an arbitrary integer of 2 or more.

The variable resistance circuit 52 illustrated in FIG. 12A may be realized by, for example, the circuit illustrated in FIG. 12B. In the circuit illustrated in FIG. 12B, series connections of n transistors $M_1$ to $M_n$ and n resistance elements $R_1$ to $R_n$ are connected in parallel between the line 62 and the line 63. Each of the transistors $M_1$ to $M_n$ is, for example, an NMOS transistor, receives the control signal FB at a gate, has a source connected to the resistance elements $R_1$ to $R_n$, and has a drain connected to the line 62. The resistance elements $R_1$ to $R_n$ have one terminal connected to the sources of the transistors $M_1$ to $M_n$ and the other terminal connected to the line 63. In the configuration, depending on which control signal FB[1:n] of the n-bit control signal FB[1:n] is set to the active level, the transistor that is turned on among the plurality of transistors $M_1$ to $M_n$ is changed, and the resistance elements $R_1$ to $R_n$ activated between the line 62 and the line 63 are changed. As a result, the resistance values of the variable delay circuits 1033n and 1034n can be adjusted according to the n-bit control signal FB[1:n].

Figure 13A:
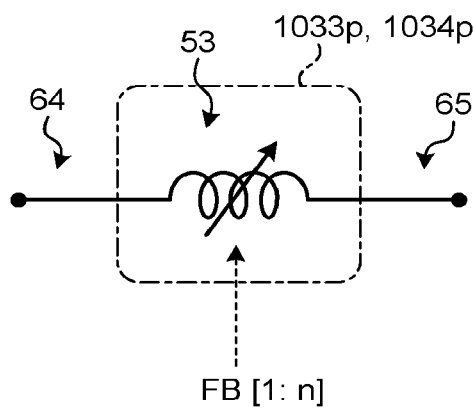
FIGS. 13A and 13B are diagrams illustrating configurations of a variable delay circuit in a transmitting device in a fifth modified example of the embodiment.
Figure 13B:
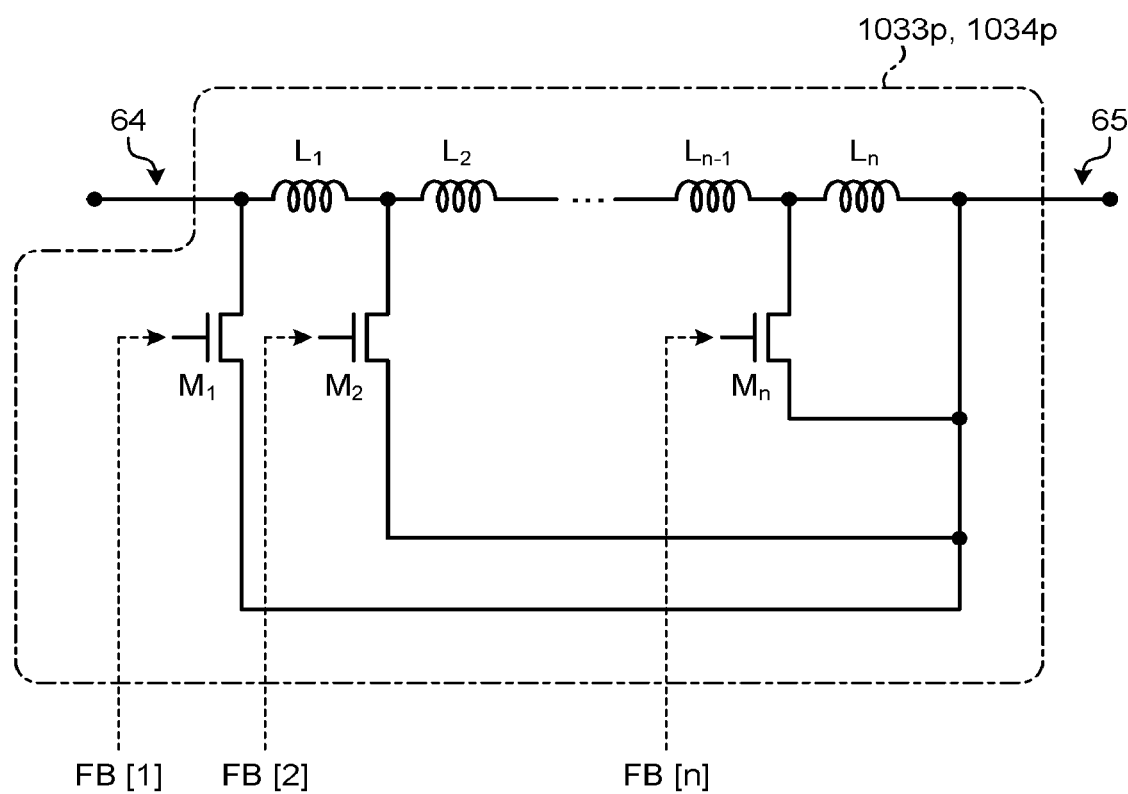

Alternatively, variable delay circuits 1033p and 1034p used in the timing adjustment circuit may be configured as illustrated in FIGS. 13A and 13B. FIGS. 13A and 13B are diagrams illustrating configurations of the variable delay circuits 1033p and 1034p in the transmitting device 100 according to a fifth modified example of the embodiment. FIG. 13A illustrates a configuration in which a variable inductance circuit 53 is connected between a line 64 on an input node side and a line 65 on an output node side of the variable delay circuits 1033p and 1034p. The variable inductance circuit 53 has one terminal electrically connected to the line 64 and the other terminal electrically connected to the line 65, and an inductance value thereof can be adjusted according to, for example, an n-bit control signal FB[1:n]. 'n' is an arbitrary integer of 2 or more.

The variable inductance circuit 53 illustrated in FIG. 13A may be realized by the circuit illustrated in FIG. 13B, for example. In the circuit illustrated in FIG. 13B, n inductance elements $L_1$ to $L_n$ are connected in series between the line 64 and the line 65, and n transistors $M_1$ to $M_n$ are connected in parallel to the inductance elements $L_1$ to $L_n$ in multiple stages. The inductance element $L_1$ has one terminal connected to the line 64 and the other terminal connected to one terminal of the inductance element $L_2$. Each of the second and subsequent inductance elements $L_2$ to $L_n$ has one terminal connected to the other terminal of the preceding inductance element and the other terminal connected to one terminal of the next inductance element. The n transistors $M_1$ to $M_n$ correspond to the n inductance elements $L_1$ to $L_n$. Each of the transistors $M_1$ to $M_n$ is, for example, an NMOS transistor, receives the control signal FB at a gate, has a source connected to one terminal of the corresponding inductance element $L_1$ to $L_n$, and has a drain connected to the line 65. In the configuration, depending on which control signal FB[1:n] of the n-bit control signal FB[1:n] is set to the active level, the transistor that is turned on among the plurality of transistors $M_1$ to M is changed, and the inductance elements $L_1$ to $L_n$ activated between the line 62 and the line 63 are changed. As a result, the inductance values of the variable delay circuits 1033p and 1034p may be adjusted according to the n-bit control signal FB[1:n].

Figure 14A:
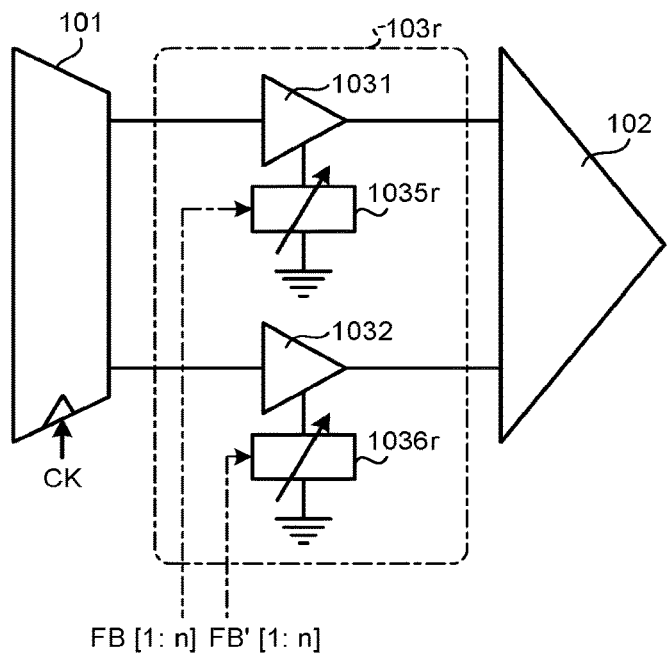
FIGS. 14A to 14C are diagrams illustrating configurations of a timing adjustment circuit in a transmitting device according to a sixth modified example of the embodiment.
Figure 14B:
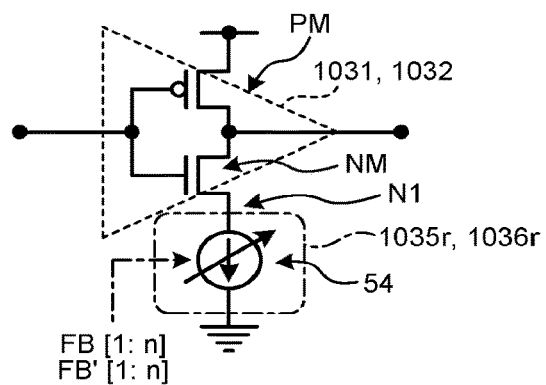
Figure 14C:
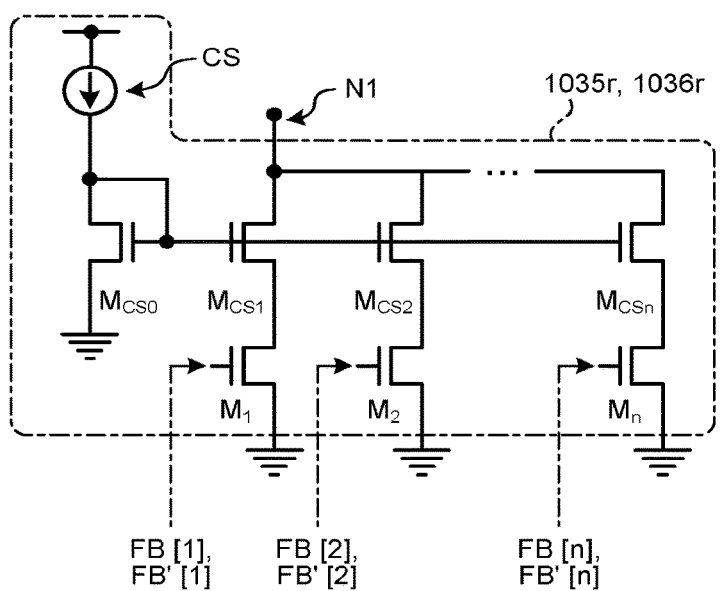

Alternatively, a timing adjustment circuit 103r may be configured as illustrated in FIGS. 14A to 14C. FIGS. 14A to 14C are diagrams illustrating a configuration of the timing adjustment circuit 103r in the transmitting device 100 according to a sixth modified example of the embodiment. In the timing adjustment circuit 103r, a variable driving force circuit 1035r is electrically connected between a ground node of a buffer amplifier 1031 and a ground potential, and a variable driving force circuit 1036r is electrically connected between a ground node of a buffer amplifier 1032 and the ground potential. The variable driving force circuit 1035r receives the control signal FB[1:n] at a control node, and adjusts a driving force by a control amount indicated by the control signal FB[1:n]. Accordingly, the buffer amplifier 1031 outputs the signal (MSB) received from the serializer 101 to the driver 102 with a driving force corresponding to the driving force after adjustment of the variable driving force circuit 1035r. The variable driving force circuit 1036r receives a control signal FB'[1:n] at a control node, and adjusts a driving force by a control amount indicated by the control signal FB'[1:n]. Accordingly, the buffer amplifier 1032 outputs the signal (LSB) received from the serializer 101 to the driver 102 with a driving force corresponding to the driving force of after adjustment of the variable driving force circuit 1036r. Also with such a configuration, the timing adjustment may be performed on the transmitting device 100 side so that the deviation $\Delta t_{BS}$ between the BIG-X timing and the SMALL-X timing is reduced.

Further, the variable driving force circuits 1035r and 1036r illustrated in FIG. 14A may be configured as illustrated in FIG. 14B. FIG. 14B illustrates a configuration in which a variable current source 54 is connected between one terminal and the other terminal of the variable driving force circuits 1035r and 1036r. The buffer amplifiers 1031 and 1032 include a PMOS transistor PM and an NMOS transistor NM connected in inverters, respectively. The variable current source 54 has one terminal connected to a node N1 on a source side of the NMOS transistor NM and the other terminal connected to a ground potential, and receives an n-bit control signal FB[1:n] (or FB'[1:n]) at a control terminal. The variable current source 54 may have a current value adjusted according to the n-bit control signal FB[1:n]. 'n' is an arbitrary integer of 2 or more.

The variable current source 54 illustrated in FIG. 14B may be realized by, for example, the circuit illustrated in FIG. 14C. In the circuit illustrated in FIG. 14C, series connections of n drive transistors $M_{CS1}$ to $M_{CSn}$ and n transistors $M_1$ to $M_n$ are connected in parallel between the node N1 and the ground potential. Each of the drive transistor $M_{CS1}$ to $M_{CSn}$ constitutes a current mirror circuit together with a drive transistor $M_{CS0}$ to which a current source CS is connected. Each of the transistors $M_1$ to $M_n$ is, for example, an NMOS transistor, receives a control signal FB at a gate, has a source connected to the ground potential, and has a drain connected to the sources of the drive transistors $M_{CS1}$ to $M_{CSn}$. The drive transistor $M_{CS0}$ is, for example, an NMOS transistor. The drive transistors $M_{CS1}$ to $M_{CSn}$ are, for example, NMOS transistors, and have gates connected to a gate and a drain of the drive transistor $M_{CS0}$, sources connected to the drains of the transistors $M_1$ to $M_n$, and drains connected to the node N1. In the configuration, depending on which control signal FB[1:n] of the n-bit control signal FB[1:n] is set to the active level, the transistor that is turned on among the plurality of transistors $M_1$ to $M_n$ is changed, and the drive transistors $M_{CS1}$ to $M_{CS1}$ activated between the node N and the ground potential are changed. As a result, the current values of the variable driving force circuits 1035r and 1036r may be adjusted according to the n-bit control signal FB[1:n].

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor integrated circuit comprising:
   a determination circuit configured to generate first transition information, second transition information, and phase determination information, with respect to a signal level of a modulation signal, the modulation signal making transition between a first signal level, a second signal level, a third signal level, and a fourth signal level, the second signal level being a level higher than the first signal level, the third signal level being a level between the first signal level and the second signal level, the fourth signal level being a level between the third signal level and the second signal level, the first transition information indicating a state of a first transition edge of transition between the first signal level and the second signal level, the second transition information indicating a state of a second transition edge of transition between the third signal level and the fourth signal level, the phase determination information indicating a result of a phase determination of a clock signal; and an estimation circuit configured to estimate a deviation between a timing of the first transition edge and a timing of the second transition edge according to the first transition information, the second transition information, and the phase determination information.

2. The semiconductor integrated circuit according to claim 1, wherein
the estimation circuit is configured to generate and output a control signal for adjusting the deviation according to an estimation result of the deviation.

3. The semiconductor integrated circuit according to claim 2, wherein
the determination circuit is configured to regenerate the first transition information, the second transition information, and the phase determination information for a signal level of a modulation signal after adjustment according to the control signal, and
the estimation circuit is configured to estimate a deviation between a timing of the first transition edge and a timing of the second transition edge according to the first transition information, the second transition information, and the phase determination information for the modulation signal after adjustment.

4. The semiconductor integrated circuit according to claim 1, wherein
the estimation circuit is configured to generate first probability information and second probability information, the first probability information indicating a ratio of a first probability and a second probability, the first probability being a probability with which a phase is determined to be advanced when the phase determination of the clock signal is performed at the timing of the first transition edge, the second probability being a probability with which the phase is determined to be delayed when the phase determination of the clock signal is performed at the timing of the first transition edge, the second probability information indicating a ratio of a third probability and a fourth probability, the third probability being a probability with which the phase is determined to be advanced when the phase determination of the clock signal is performed at the timing of the second transition edge, the fourth probability being a probability with which the phase is determined to be delayed when the phase determination of the clock signal is performed at the timing of the second transition edge, and
the estimation circuit is configured to estimate the deviation according to the first probability information and the second probability information.

5. The semiconductor integrated circuit according to claim 4, wherein
the estimation circuit is configured to obtain a first timing at which a large or small relationship between the first probability and the second probability in a transition period of data is reversed, to obtain a second timing at which a large or small relationship between the third probability and the fourth probability in the transition period is reversed, and to obtain a time interval between the first timing and the second timing as the deviation.

6. The semiconductor integrated circuit according to claim 5, wherein
the estimation circuit is configured to accumulate the first probability information for a plurality of transition periods, to obtain the first timing according to a plurality of pieces of accumulated first probability information, to accumulate the second probability information for the plurality of transition periods, and to obtain the second timing according to a plurality of pieces of accumulated second probability information.

7. The semiconductor integrated circuit according to claim 1, wherein
the estimation circuit includes
a first logic gate group corresponding to the first transition information,
a second logic gate group corresponding to the second transition information,
a first counter group corresponding to the first transition information and electrically connected to the first logic gate group,
a second counter group corresponding to the second transition information and electrically connected to the second logic gate group,
a first comparator corresponding to the first transition information and electrically connected to the first counter group,
a second comparator corresponding to the second transition information and electrically connected to the second counter group, and
a phase information confirmation device electrically connected to the first comparator and the second comparator.

8. The semiconductor integrated circuit according to claim 7, wherein
the determination circuit is configured to generate first phase determination information indicating that the phase of the clock signal is advanced, or second phase determination information indicating that the phase of the clock signal is delayed,
the first logic gate group includes
a first logic gate configured to calculate a logic product of the first transition information and the first phase determination information, and
a second logic gate configured to calculate a logic product of the first transition information and the second phase determination information, and
the second logic gate group includes
a third logic gate configured to calculate a logic product of the second transition information and the first phase determination information, and
a fourth logic gate configured to calculate a logic product of the second transition information and the second phase determination information.

9. A receiving device comprising:
a receiving node to which a wired transmission path is connectable;
the semiconductor integrated circuit according to claim 1 to which the receiving node is electrically connected; and
a clock regeneration circuit to which the semiconductor integrated circuit is electrically connected.

10. The receiving device according to claim 9, wherein the estimation circuit is configured to generate and output a control signal for adjusting the deviation according to an estimation result of the deviation.

11. The receiving device according to claim 10, wherein the determination circuit is configured to regenerate the first transition information, the second transition information, and the phase determination information for a signal level of a modulation signal after adjustment according to the control signal, and
the estimation circuit is configured to estimate a deviation between a timing of the first transition edge and a timing of the second transition edge according to the first transition information, the second transition information, and the phase determination information for the modulation signal after adjustment.

12. The receiving device according to claim 9, wherein the estimation circuit is configured to generate first probability information and second probability information, the first probability information indicating a ratio of a first probability and a second probability, the first probability being a probability with which a phase is determined to be advanced when the phase determination of the clock signal is performed at the timing of the first transition edge, the second probability being a probability with which the phase is determined to be delayed when the phase determination of the clock signal is performed at the timing of the first transition edge, the second probability information indicating a ratio of a third probability and a fourth probability, the third probability being a probability with which the phase is determined to be advanced when the phase determination of the clock signal is performed at the timing of the second transition edge, the fourth probability being a probability with which the phase is determined to be delayed when the phase determination of the clock signal is performed at the timing of the second transition edge, and
the estimation circuit is configured to estimate the deviation according to the first probability information and the second probability information.

13. The receiving device according to claim 12, wherein the estimation circuit is configured to obtain a first timing at which a large or small relationship between the first probability and the second probability in a transition period of data is reversed, to obtain a second timing at which a large or small relationship between the third probability and the fourth probability in the transition period is reversed, and to obtain a time interval between the first timing and the second timing as the deviation.

14. The receiving device according to claim 13, wherein the estimation circuit is configured to accumulate the first probability information for a plurality of transition periods, to obtain the first timing according to a plurality of pieces of accumulated first probability information, to accumulate the second probability information for the plurality of transition periods, and to obtain the second timing according to a plurality of pieces of accumulated second probability information.

15. The receiving device according to claim 9, wherein the estimation circuit includes
a first logic gate group corresponding to the first transition information,
a second logic gate group corresponding to the second transition information,
a first counter group corresponding to the first transition information and electrically connected to the first logic gate group,
a second counter group corresponding to the second transition information and electrically connected to the second logic gate group,
a first comparator corresponding to the first transition information and electrically connected to the first counter group,
a second comparator corresponding to the second transition information and electrically connected to the second counter group, and
a phase information confirmation device electrically connected to the first comparator and the second comparator.

16. The receiving device according to claim 15, wherein the determination circuit is configured to generate first phase determination information indicating that the phase of the clock signal is advanced, or second phase determination information indicating that the phase of the clock signal is delayed,
the first logic gate group includes
a first logic gate configured to calculate a logic product of the first transition information and the first phase determination information, and
a second logic gate configured to calculate a logic product of the first transition information and the second phase determination information, and
the second logic gate group includes
a third logic gate configured to calculate a logic product of the second transition information and the first phase determination information, and
a fourth logic gate configured to calculate a logic product of the second transition information and the second phase determination information.

17. A control method of a receiving device, the control method comprising:
generating first transition information, second transition information, and phase determination information, with respect to a signal level of a modulation signal, the modulation signal making transition between a first signal level, a second signal level, a third signal level, and a fourth signal level, the second signal level being a level higher than the first signal level, the third signal level being a level between the first signal level and the second signal level, the fourth signal level being a level between the third signal level and the second signal level, the first transition information indicating a state of a first transition edge of transition between the first signal level and the second signal level, the second transition information indicating a state of a second transition edge of transition between the third signal level and the fourth signal level, the phase determination information indicating a result of a phase determination of a clock signal; and
estimating a deviation between a timing of the first transition edge and a timing of the second transition edge according to the first transition information, the second transition information, and the phase determination information.

18. The control method of a receiving device according to claim 17, further comprising
generating a control signal for adjusting the deviation according to an estimation result of the deviation and outputting the control signal to a transmitting device.

19. The control method of a receiving device according to claim 18, further comprising:
regenerating the first transition information, the second transition information, and the phase determination information with respect to a signal level of the modulation signal after adjustment according to the control signal; and
estimating a deviation between a timing of the first transition edge and a timing of the second transition edge according to the first transition information, the second transition information, and the phase determination information for the modulation signal after adjustment.

20. The control method of a receiving device according to claim 17, wherein
the estimating includes
generating first probability information and second probability information, the first probability information indicating a ratio of a first probability and a second probability, the first probability being a probability with which a phase is determined to be advanced when the phase determination of the clock signal is performed at the timing of the first transition edge, the second probability being a probability with which the phase is determined to be delayed when the phase determination of the clock signal is performed at the timing of the first transition edge, the second probability information indicating a ratio of a third probability and a fourth probability, the third probability being a probability with which the phase is determined to be advanced when the phase determination of the clock signal is performed at the timing of the second transition edge, the fourth probability being a probability with which the phase is determined to be delayed when the phase determination of the clock signal is performed at the timing of the second transition edge, and
estimating the deviation according to the first probability information and the second probability information.

* * * * *